(12) United States Patent
Tanaka

(10) Patent No.: US 7,799,702 B1
(45) Date of Patent: Sep. 21, 2010

(54) METHOD OF MANUFACTURING NONVOLATILE MEMORY DEVICE

(75) Inventor: Toshiharu Tanaka, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/560,011

(22) Filed: Sep. 15, 2009

(30) Foreign Application Priority Data

Mar. 24, 2009 (JP) .............................. 2009-071675

(51) Int. Cl.
*H01L 21/31* (2006.01)
(52) U.S. Cl. ...................................... 438/758
(58) Field of Classification Search ........................ None
See application file for complete search history.

(56) References Cited

U.S. PATENT DOCUMENTS

2006/0289942 A1 12/2006 Horii et al.
2007/0224770 A1 9/2007 Nagashima
2008/0014750 A1 1/2008 Nagashima

OTHER PUBLICATIONS

Myoung-Jae Lee, et al., "2-stack 1D-1R Cross-point Structure with Oxide Diodes as Switch Elements for High Density Resistance RAM Applications", Electron Devices Meeting, 2007. IEDM 2007. IEEE International, Dec. 10-12, 2007 pp. 771-774.
S. B. Herner, et al., "Vertical p-i-n Polysilicon Diode with Antifuse for Stackable Field-Programmable ROM", IEEE Electron Device Letters, vol. 25, No. 5, May 2004, pp. 271-273.

*Primary Examiner*—Scott B Geyer
(74) *Attorney, Agent, or Firm*—Oblon, Spivak, McClelland, Maier & Neustadt, L.L.P.

(57) ABSTRACT

A method of manufacturing a nonvolatile memory device according to an embodiment of the present invention comprises: forming a metal film containing metal whose oxide functions as a variable resistive material and which reacts with silicon through heat treatment and forms metal silicide, on an interlayer insulating film having a silicon layer, which is patterned in a predetermined shape and connected to a first wire, with the surface thereof exposed, performing heat treatment to form a silicide layer on the surface of the silicon layer, oxidizing the silicide layer to form a variable resistive layer on an upper part of the silicon layer, and forming a second wire coupled to the variable resistive layer.

20 Claims, 21 Drawing Sheets

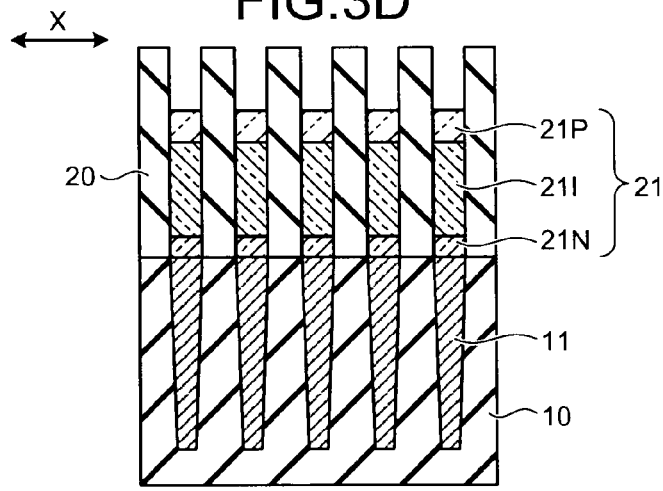
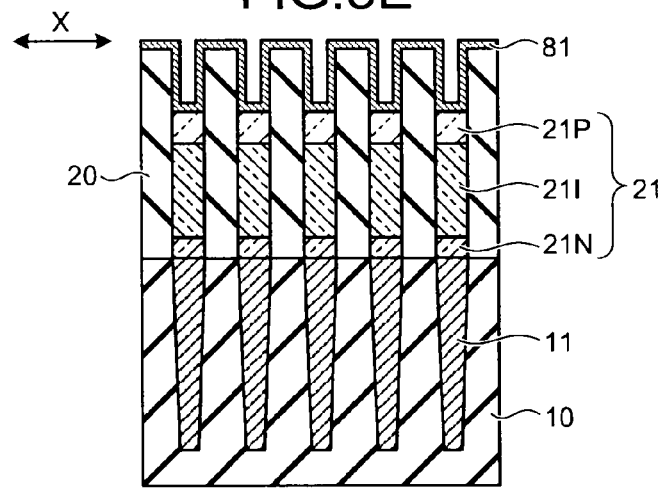
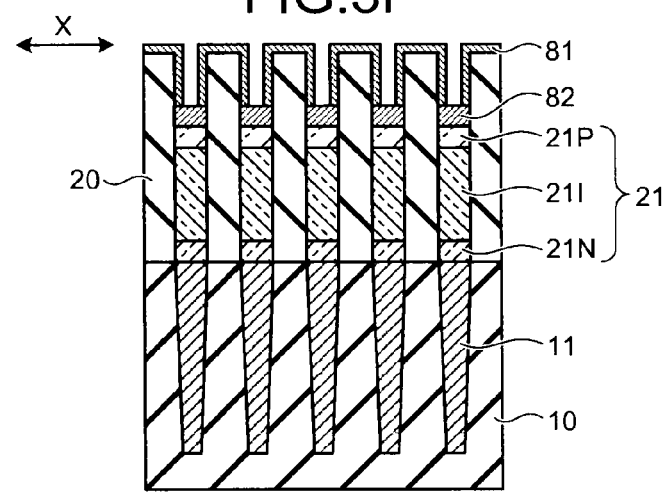

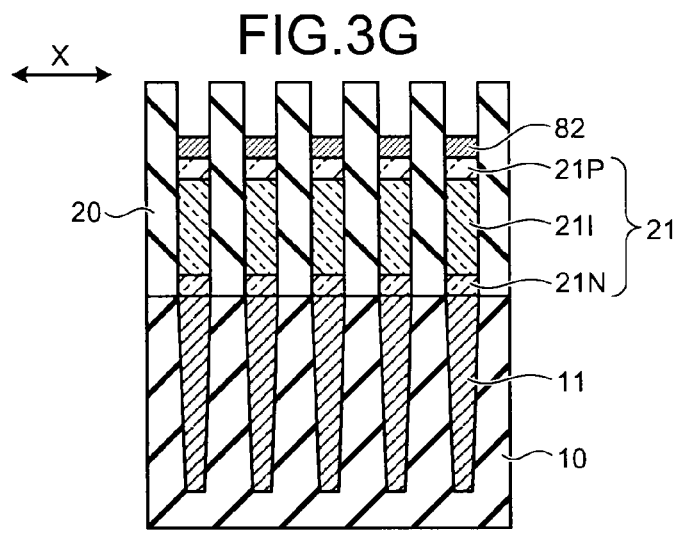
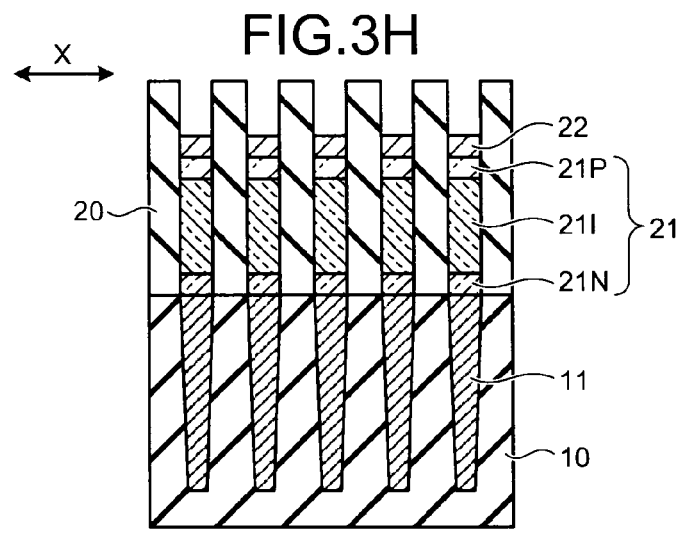
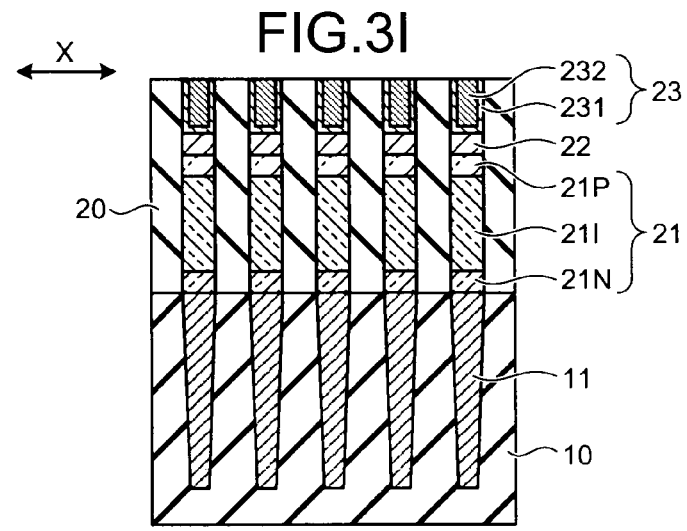

METHOD OF MANUFACTURING NONVOLATILE MEMORY DEVICE

CROSS-REFERENCE TO RELATED APPLICATIONS

This application is based upon and claims the benefit of priority from the prior Japanese Patent Application No. 2009-071675, filed on Mar. 24, 2009; the entire contents of which are incorporated herein by reference.

BACKGROUND OF THE INVENTION

1. Field of the Invention

The present invention relates to a method of manufacturing a nonvolatile memory device.

2. Description of the Related Art

In recent years, a resistive random access memory (ReRAM) that stores, in a nonvolatile manner, resistance information, for example, a high resistance state and a low resistance state of an electrically rewritable variable resistive element attracts attention as a nonvolatile memory device. In such a ReRAM, for example, variable resistance memory cells in which variable resistive elements as storage elements and rectifying elements such as diodes are connected in series are arranged in an array shape in intersections of a plurality of bit lines extending in parallel to a first direction and a plurality of word lines extending in parallel to a second direction perpendicular to the first direction (see, for example, Myoung-Jae Lee et al., "2-stack 1D-1R Cross-point Structure with Oxide Diodes as Switch Elements for High Density Resistance RAM Applications", IEEE, pp. 771-774, 2007). Examples of the variable resistive elements include metal oxides such as NiO, a high resistance state and a low resistance state of which can be switched according to control of a voltage value and voltage application time.

Such the ReRAM can be manufactured by a method same as a method of manufacturing a field-programmable ROM that has columnar structure in which diode layer and insulating layer are connected in series in cross-points of a plurality of first wires extending in parallel to a first direction and a plurality of second wires extending in parallel to a second direction perpendicular to the first direction (see, for example, S. B. Herner et al., "Vertical p-i-n polysilicon diode with antifuse for stackable field-programmable ROM", Electron Device Letters, IEEE, vol. 25, no. 5, pp. 271-273, May 2004). For example, first, a diode material as a material of the rectifying element, a variable resistive material as a material of the variable resistive element, and a metal material as a material of an electrode are deposited in order. Subsequently, a resist applied on the metal material is exposed and developed by the photolithography technique into a desired pattern to form a mask. Thereafter, the metal material, the variable resistive material, and the diode material are etched by the anisotropic etching using the mask. Consequently, the ReRAM can be formed.

However, because various deposited films are collectively processed in such a process, a mask material having thickness sufficient for withstanding the processing is necessary. A processing technique with a high ratio of depth to width of a groove to be etched (hereinafter, "aspect ratio") is required. The likelihood of collapse of patterns of variable resistance memory cells formed in a columnar structure increases after the processing because of the high aspect ratio.

BRIEF SUMMARY OF THE INVENTION

A method of manufacturing a nonvolatile memory device according to an embodiment of the present invention comprises: forming a metal film containing metal whose oxide functions as a variable resistive material and which reacts with silicon through heat treatment and forms metal silicide, on an interlayer insulating film having a silicon layer with rectification whose surface is exposed, which is connected to a first wire and is patterned in a predetermined shape; performing the heat treatment to form a silicide layer on a surface of the silicon layer in a self-aligning manner; oxidizing the silicide layer to form a variable resistive layer on an upper part of the silicon layer; and forming a second wire having a predetermined shape coupled to the variable resistive layer.

A method of manufacturing a nonvolatile memory device according to an embodiment of the present invention comprises: forming a plurality of first wires extending in parallel in a first direction; forming a silicon film with rectification above the first wires; patterning the silicon film in a columnar shape to form silicon layers to be coupled to the first wires; embedding an interlayer insulating film among the columnar silicon layers; forming, on the interlayer insulating film having the silicon layers with surfaces thereof exposed, a metal film containing metal whose oxide functions as a variable resistive material and which reacts with silicon through heat treatment and forms metal silicide; performing the heat treatment to form silicide layers on surfaces of the silicon layers in a self-aligning manner; oxidizing the silicide layers to form variable resistive layers on upper parts of the silicon layers; and forming a plurality of second wires coupled to the variable resistive layers and extending in parallel in a second direction crossing the first direction.

A method of manufacturing a nonvolatile memory device according to an embodiment of the present invention comprises: laminating, in order, a first wiring layer as a material of a first wire and a silicon film having rectification; patterning the first wiring layer and the silicon film in a stripe shape extending in a predetermined direction; embedding an interlayer insulating film between lower structures patterned in the stripe shape; forming, on the interlayer insulating film having the silicon film with a surface thereof exposed, a metal film containing metal whose oxide functions as a variable resistive material and which reacts with silicon through heat treatment and forms metal silicide; performing the heat treatment to form a silicide layer on a surface of the silicon film in a self-aligning manner; oxidizing the silicide layer to form a variable resistive layer on an upper part of the silicon film; forming a second wiring layer as a material of a second wire above the variable resistive layer and the interlayer insulating film; and patterning, in a stripe shape extending in a direction perpendicular to the lower structures below the second wiring layer, the second wiring layer, the variable resistive layer, and the silicon film in the lower structures.

BRIEF DESCRIPTION OF THE DRAWINGS

FIGS. 3A to 3I are schematic sectional views of an example of a procedure for a method of manufacturing a nonvolatile memory device according to a first embodiment of the present invention;

DETAILED DESCRIPTION OF THE INVENTION

Exemplary embodiments of the present invention are explained in detail below with reference to the accompanying drawings. The present invention is not limited by the embodiments. Sectional view of nonvolatile memory devices used in embodiments explained below are schematic. A relation between the thickness and the width of a layer, a ratio of thicknesses of layers, and the like are different from real ones. Further, film thicknesses explained below are examples only. Film thicknesses are not limited to these film thicknesses.

Figure 1:
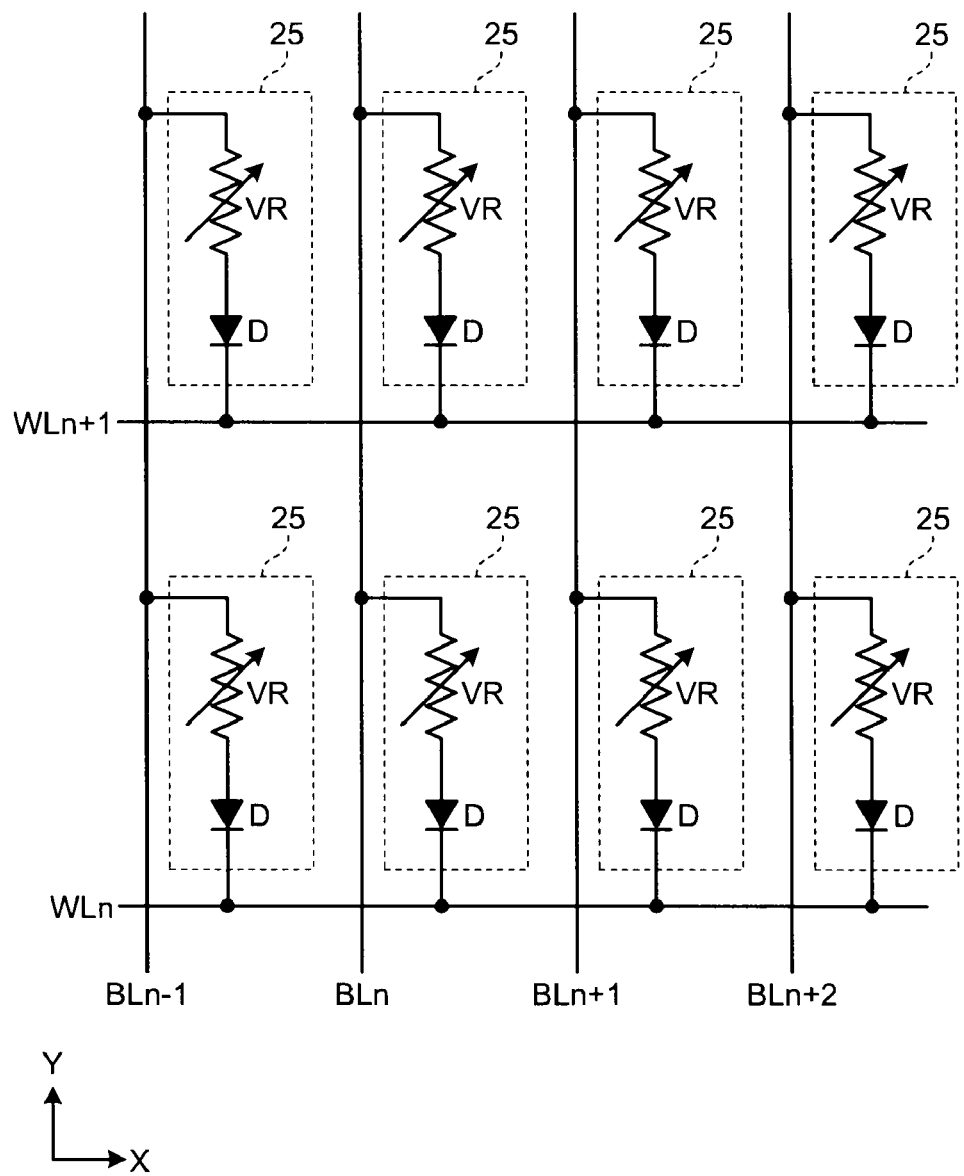
FIG. 1 is a diagram of a memory cell array configuration of a nonvolatile memory device according to embodiments of the present invention.

FIG. 1 is a diagram of an example of a memory cell array configuration of a nonvolatile memory device according to embodiments of the present invention. In the figure, a left to right direction in a paper surface is represented as X direction and a direction perpendicular to the X direction in the paper surface is represented as Y direction. Word lines WLi (i=n, n+1, . . . ) extending in parallel to the X direction (a row direction) and bit lines BLj (j=n−1, n, n+1, n+2, . . . ) extending in parallel to the Y direction (a column direction) at height different from that of the word lines WLi are disposed to intersect each other. Variable resistance memory cells 25 in which variable resistive elements VR and rectifying elements D are connected in series are arranged in the intersections. In this example, one ends of the variable resistive elements VR are connected to the bit lines BLj and the other ends thereof are connected to the word lines WLi via the rectifying elements D.

Figure 2:
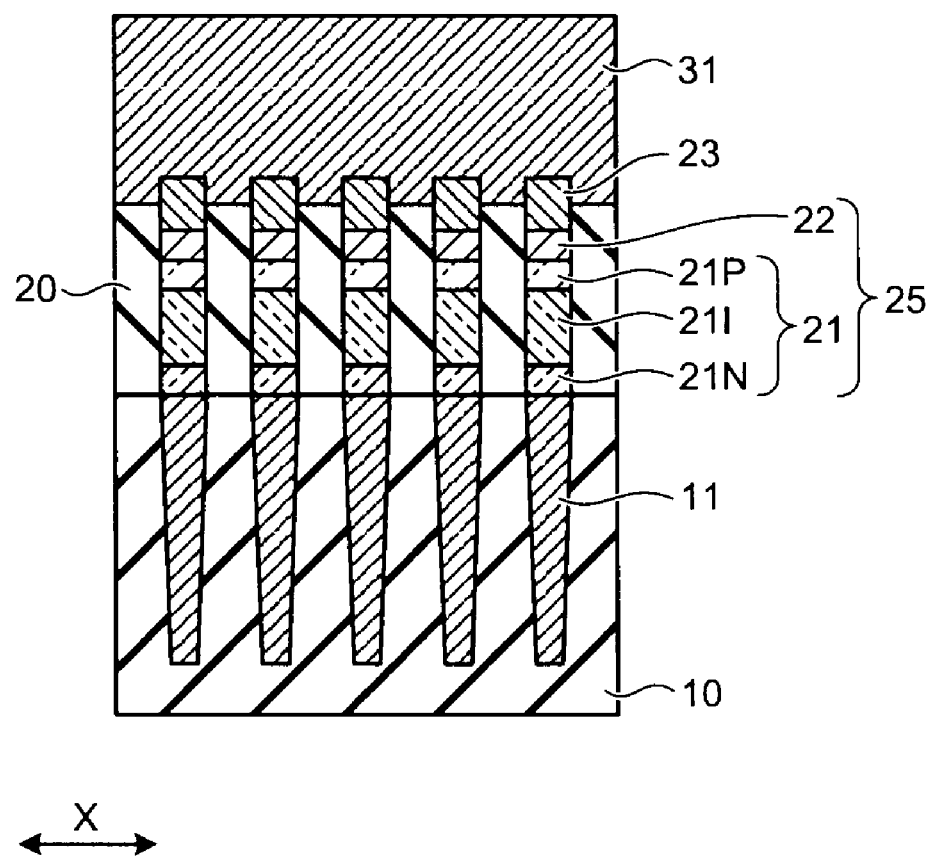
FIG. 2 is a schematic sectional view of an example of the structure of a memory cell.

FIG. 2 is a schematic sectional view of an example of the structure of a memory cell. In this figure, a state of a part of a section on a certain word line WLi along the X direction shown in FIG. 1 is shown. In the following explanation, the bit lines BLj correspond to first wires 11 and the word lines WLi correspond to second wires 31. In a first interlayer insulating film 10, a plurality of the first wires 11 (the bit lines BLj) extending in the Y direction are formed in parallel at predetermined intervals. In a not-shown third interlayer insulating film formed on the first interlayer insulating film 10 via a second interlayer insulating film 20, the second wires 31 (the word lines WLi) extending in the X direction orthogonal to the first wires 11 is formed. On an area where the respective first wires 11 cross the second wire 31, diode layer 21 as rectifying element D and variable resistive layer 22 as variable resistive element VR are laminated in order. The variable resistive layer 22 is connected to the second wire 31 via conductive cap film 23, so the second wire 31 is coupled to the variable resistive layer 22.

The diode layer 21 is made of a material having rectification. Examples of the diode layer 21 include silicon having PIN structure. For example, a polysilicon film in which an N-type polysilicon film 21N having thickness of about 20 nanometers, an I-type polysilicon film 21I having thickness of about 110 nanometers, and a P-type polysilicon film having thickness of about 20 nanometers are laminated in order from the first wire 11 side or a polysilicon film in which a P-type polysilicon film 21P having thickness of about 20 nanometers, an I-type polysilicon film 21I having thickness of about 110 nanometers, and an N-type polysilicon film 21N having thickness of about 20 nanometers are laminated in order can be used as the diode layer 21.

The variable resistive layer 22 is made of a material, a high resistance state and a low resistance state of which can be switched according to control of a voltage value and voltage application time, and are made of a material containing an element that reacts with silicon to form metal silicide. Examples of the material include metal oxides such as NiO, MnO, and $TiO_2$. In this embodiment, NiO having thickness of 5 nanometers to 10 nanometers is used as the variable resistive layer 22.

The cap film 23 made of a material same as that of the second wire 31 is formed on the variable resistive layer 22. The second wire 31 extending in the X direction is formed on the cap film 23. As explained later, the cap film 23 is film desired in terms of a process when the second wire 31 is formed above the variable resistive layer 22 after the variable resistive layer 22 is formed. The cap film 23 and the variable resistive layer 22 of memory cells are set in ohmic contact with each other.

FIGS. 3A to 3I are schematic sectional views of an example of a procedure for a method of manufacturing a nonvolatile memory device according to a first embodiment. First, the first interlayer insulating film 10 is formed on a not-shown substrate such as a Si substrate. The first wires 11 extending in the Y direction are formed in the upper surface of the first interlayer insulating film 10 by a method such as the damascene method. On the substrate under the first interlayer insulating film 10, an element such as a complementary metal-oxide semiconductor (CMOS) transistor is formed.

Figure 3A:
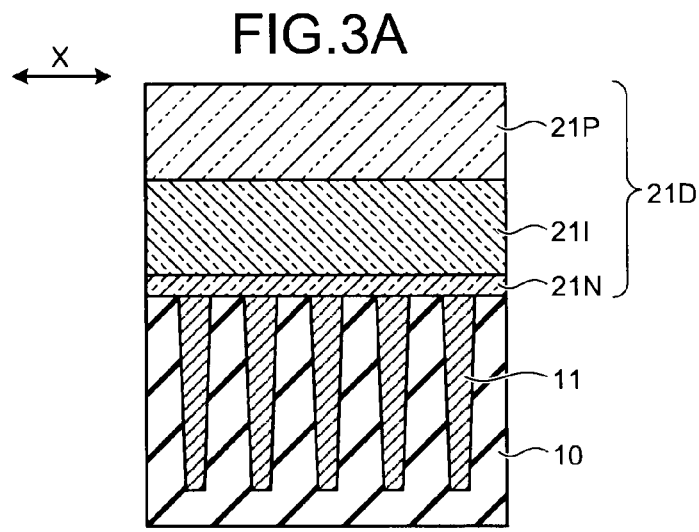

Subsequently, on the first interlayer insulating film 10 in which the first wires 11 are formed, the N-type polysilicon film 21N having thickness of about 20 nanometers, the I-type polysilicon film 21I having thickness of about 110 nanometers, and the P-type polysilicon film 21P having thickness of about 100 nanometers are deposited in order by a film preparation method such as the chemical vapor deposition (CVD) method to form a diode layer 21D (FIG. 3A). The N-type polysilicon film 21N is obtained by depositing a silicon film while introducing an N-type impurity such as phosphor (P). The I-type polysilicon film 21I is obtained by depositing a silicon film in an environment in which an impurity is not introduced. The P-type polysilicon film 21P is obtained by depositing a silicon film while introducing a P-type impurity such as boron (B).

Figure 3B:
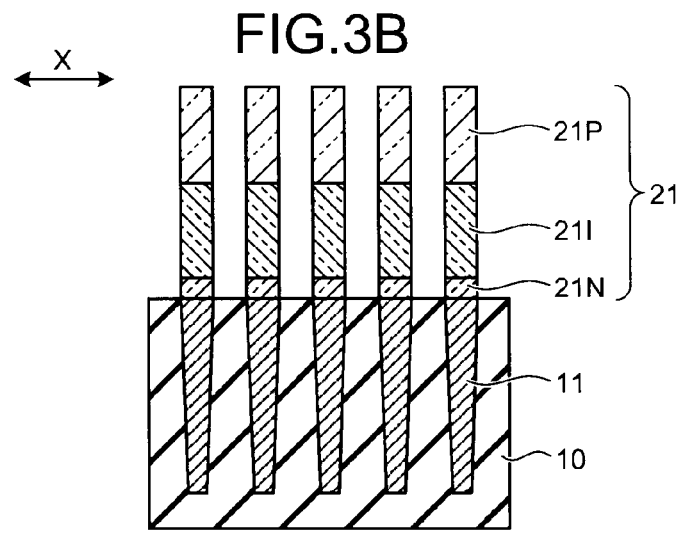

A resist is applied on the diode layer 21D and patterned into a desired pattern by the photolithography technique to form a mask. The diode layer 21D is processed by the anisotropic etching such as the reactive ion etching (RIE) to form columnar diode layer 21 (FIG. 3B). The columnar diode layers 21 are etched to be located on the first wires 11.

Figure 3C:
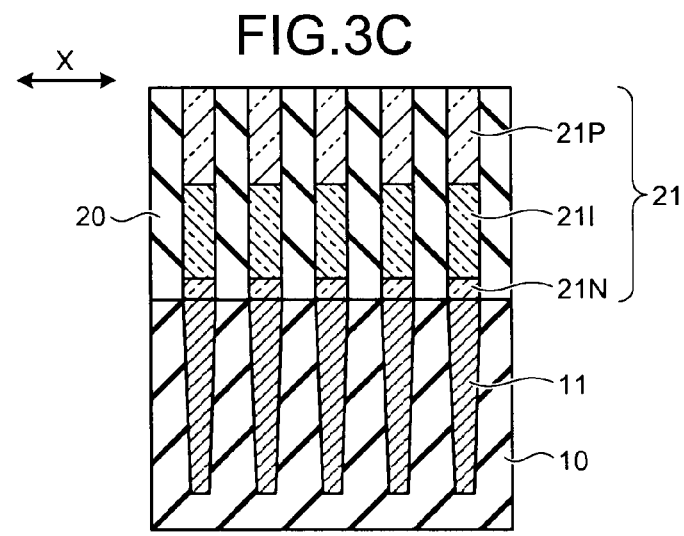

Thereafter, the second interlayer insulating film 20 is deposited to fill spaces among the columnar diode layers 21 and formed in a position higher than the upper surface of the diode layer 21. A high density plasma-undoped silicate glasses (HDP-USG) film formed by, for example, the plasma CVD method is deposited as the second interlayer insulating film 20 at thickness of 400 nanometers to 500 nanometers. The upper surface of the second interlayer insulating film 20 is planarized by the method such as the chemical mechanical polishing (CMP) method until the upper surface of the diode layer 21 is exposed (FIG. 3C). Consequently, the thickness of the second interlayer insulating film 20 is set to about 230 nanometers.

Subsequently, the anisotropic etching is performed under a condition that the diode layer 21 is more easily etched than the second interlayer insulating film 20. The upper surface of the diode layer 21 is etched back by appropriate depth, for example, 70 nanometers to 75 nanometers (FIG. 3D). Thereafter, a metal film 81 containing metal (e.g., Ni, Mn, or Ti) whose oxide functions as a variable resistive material and which reacts with silicon through heat treatment and forms a metal silicide, is deposited (FIG. 3E). The heat treatment is performed to silicide the diode layer 21 up to appropriate depth from the surface. Thereby, a silicide layer 82, for example, $NiSi_2$, MnSi, or $TiSi_2$ is formed in an upper part of the diode layer 21 (FIG. 3F). Because the diode layer 21 is made of polysilicon, the diode layer 21 reacts with the metal film 81 through the heat treatment and forms silicide. However, the second interlayer insulating film 20 does not react with the metal film 81. For example, when a Ni film is used as the metal film 81, an upper part of the diode layer 21 can be silicided into $NiSi_2$ by performing the heat treatment in a nitrogen atmosphere for 60 seconds to 120 seconds at temperature of 400° C. to 600° C. It is assumed that the silicide layer 82 is formed in a range of 5 nanometers to 10 nanometers.

The non-reacting metal film 81 on the diode layer 21 and the metal film 81 formed on the upper surface and sides of the second interlayer insulating film 20 are removed by a method such as wet cleaning treatment (FIG. 3G). Consequently, only the surface portion of the diode layer 21 exposed between the second interlayer insulating films 20 adjacent to each other in FIG. 3D is silicided in a self-aligning manner.

Thereafter, the surfaces of the silicide layers 82 are forcibly oxidized and changed into metal oxide (e.g., NiO, MnO, or $TiO_2$) by a method such as thermal oxidation treatment in an oxygen atmosphere. Therefore, variable resistive layers 22 are formed in upper parts of the diode layers 21 (FIG. 3H). For example, the silicide layers 82 in a range of depth of 5 nanometers to 10 nanometers from the surface are forcibly oxidized and changed to the variable resistive layers 22. Oxidation time is adjusted such that the depth of the silicide layers 82 to be forcibly oxidized is set to be equal to or smaller than the depth of the diode layers 21 to have been silicided in FIG. 3F. This is because, if the depth of the silicide layers 82 to be forcibly oxidized is larger than the depth of the diode layers 21 silicided in FIG. 3F, an insulative silicon oxide is generated between the metal oxide and the diode layers 21. Although silicon is contained in the variable resistive layers 22 (the metal oxide), the silicon does not affect a variable resistive characteristic of the variable resistive layers 22.

After a barrier metal layer 231 of TiN or the like is formed in thickness of, for example, 3 nanometers to 10 nanometers on the variable resistive layers 22 and the second interlayer insulating film 20, a metal material 232 such as tungsten (W) is embedded in a step formed by etching back the upper parts of the diode layers 21, which is coated with the barrier metal layer 231 to form the cap film 23. Then, the cap film 23 formed above the second interlayer insulating film 20 is removed by the CMP method or the like to planarize the cap film 23 (FIG. 3I). Consequently, the step formed by etching back the upper parts of the diode layers 21 is completely filled and planarized.

When the planarization is performed without embedding the cap film 23, it is likely that the upper surface of the second interlayer insulating film 20 recedes and the variable resistive layers 22 are subjected to the CMP treatment. If the variable resistive layers 22 are subjected to the CMP treatment, it is likely that a characteristic undesirably changes. Therefore, the variable resistive layers 22 are prevented from being subjected to the CMP treatment and the deterioration in the characteristic is prevented by forming the cap film 23 on the variable resistive layers 22.

Thereafter, the not-shown third interlayer insulating film is formed on the cap film 23 and the second interlayer insulating film 20 and, after the upper surface of the third interlayer insulating film is planarized, a resist material is applied on the third interlayer insulating film. A mask is formed by the photolithography technique to have a shape corresponding to the second wires 31 (the word lines WLi). The third interlayer insulating film is etched by using the mask to form grooves for forming second wires 31. A metal material such as W is embedded in the grooves to form the second wires 31. Consequently, the nonvolatile memory device shown in FIG. 2 is obtained. Thereafter, the steps explained above can be repeated a necessary number of times to form a pad wire on a top layer, whereby the nonvolatile memory device is completed.

According to the first embodiment, the second interlayer insulating film 20 is embedded among the diode layers 21 made of silicon processed in a columnar shape. After the metal film 81 that includes metal whose oxide functions as the variable resistive material and which forms a metal silicide by reacting with silicon through the heat treatment, is formed on the diode layers 21 and the second interlayer insulating film 20, silicide layers 82 are formed by the heat treatment. Then, the variable resistive layers 22 are formed to oxidize the silicide layer 82 forcibly. Therefore, there is an effect that the formation of the variable resistive layers 22 can be performed in a self-aligning manner. Because the diode layers 21D made of silicon is processed into a columnar shape after being formed, the thickness of a mask can be reduced compared with that of a mask processed after being formed by laminating a diode layer, a variable resistive layer, and an electrode layer as in the prior art. Also, because an aspect ratio of the depth to the width of the grooves during processing is low, memory cells can be prevented from collapsing. Further, an embedding margin can be sufficiently secured concerning the embedding of the second interlayer insulating film 20 after that.

The metal film 81 is formed after the upper surfaces of the diode layers 21 are reduced to be lower than the upper surface of the second interlayer insulating film 20. Therefore, even when the upper parts of the diode layers 21 expand by a silicide reaction, a distance between the diode layers 21 of the memory cells adjacent to each other can be secured. Therefore, a processing margin can be secured.

In the first embodiment explained above, the metal film is deposited to form the variable resistive layers after the upper surfaces of the diode layers are reduced to be lower than the upper surface of the second interlayer insulating film. In a second embodiment of the present invention, a method of forming the variable resistive layers without etching back the upper surfaces of the diode layers is adopted.

FIGS. 4A to 4E are schematic sectional views of an example of a method of manufacturing a nonvolatile memory device according to the second embodiment. First, as shown in FIGS. 3A to 3C in the first embodiment, the N-type polysilicon film 21N, the I-type polysilicon film 21I, and the P-type polysilicon film 21P are laminated in order on the first interlayer insulating film 10, on the upper surface of which the first wires 11 extending in the Y direction are formed, to form the diode layer 21D. The diode layer 21D is patterned into a desired pattern by using the photolithography technique to form the columnar diode layer 21. Thereafter, the second interlayer insulating film 20 is embedded among the columnar diode layers 21. The second interlayer insulating film 20 is planarized by the CMP method or the like to expose the surfaces of the columnar diode layers 21.

Figure 4A:
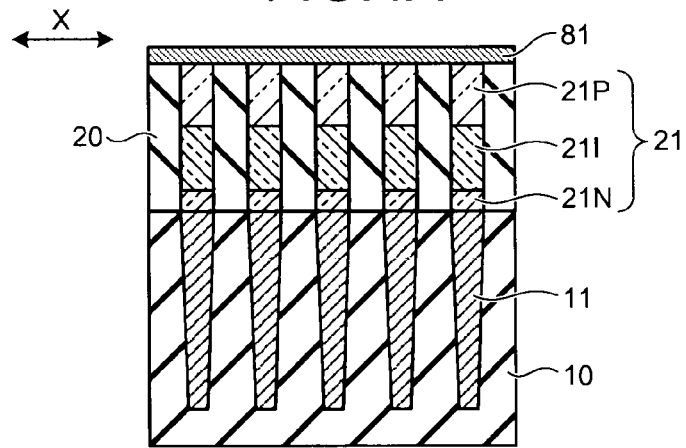
FIGS. 4A to 4E are schematic sectional views of an example of a method of manufacturing a nonvolatile memory device according to a second embodiment of the present invention.
Figure 4B:
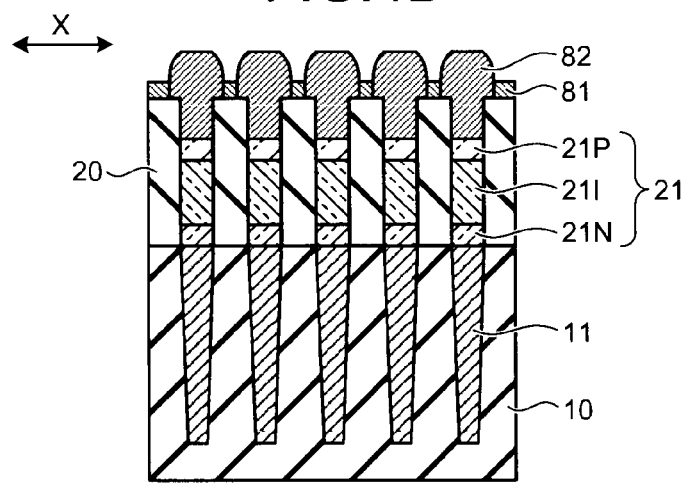

The metal film 81 containing metal (e.g., Ni, Mn, or Ti) whose oxide functions as a variable resistive material and which reacts with silicon through heat treatment and forms metal silicide, is deposited on the planarized second interlayer insulating film 20 including the columnar diode layers 21 (FIG. 4A). The heat treatment is performed to silicide the diode layers 21 up to appropriate depth from the surface. Thereby, the silicide layers 82 are formed on the surfaces of the diode layers 21 (FIG. 4B). The upper parts of the polysilicon film forming the diode layers 21 expand in volume by this silicide reaction and spread to the second interlayer insulating film 20 between the columnar diode layers 21 adjacent to each other. However, the metal film 81 formed on the second interlayer insulating film 20 does not react with the second interlayer insulating film 20 through the heat treatment.

Figure 4C:
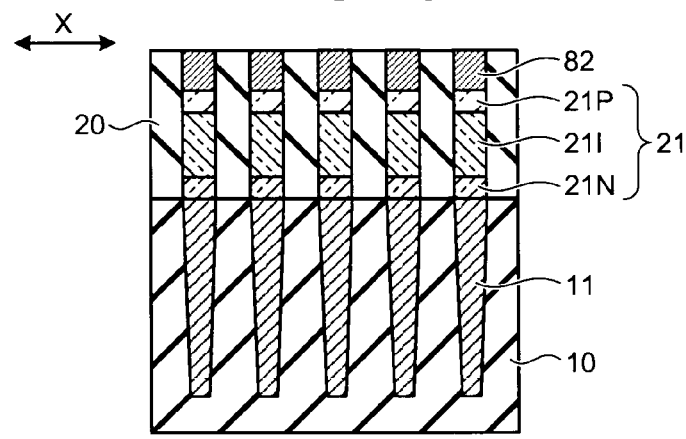

Thereafter, the non-reacting metal film 81 on the diode layers 21 (the silicide layers 82) and the excess non-reacting metal film 81 formed on the second interlayer insulating film 20 are removed by a method such as wet cleaning treatment. Consequently, only the surface portions of the diode layers 21 (polysilicon) exposed between the second interlayer insulating films 20 adjacent to each other in FIG. 3C are silicided in a self-aligning manner. When it is likely that the portion expanding in volume in the upper parts of the diode layers 21 by this silicide reaction causes deficiencies in terms of device operation, the excess portion can be scraped and planarized by the CMP method or the like (FIG. 4C).

Figure 4D:
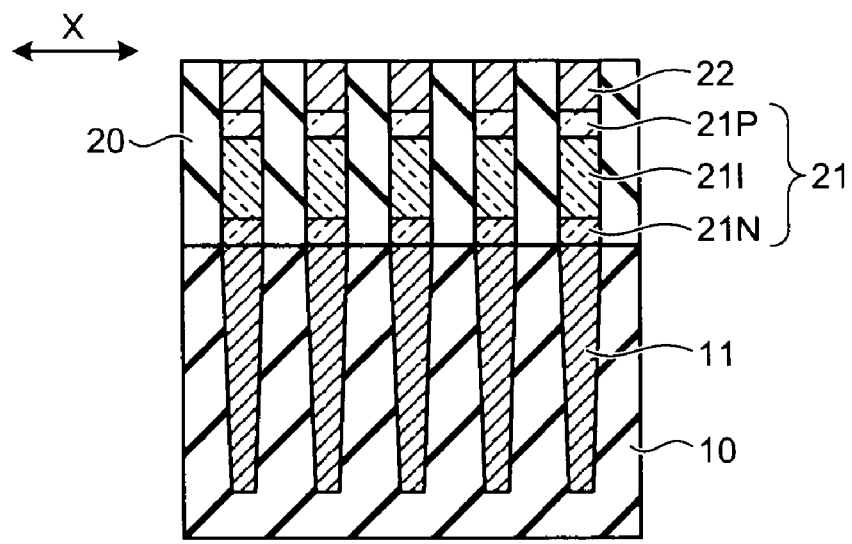

Subsequently, at least a part of the silicide layers 82, for example, the silicide layers 82 in a range of depth of 5 nanometers to 10 nanometers from the surface are forcibly oxidized by a method such as thermal oxidation treatment in an oxygen atmosphere to change the silicide layers 82 to a metal oxide. Thereby, the variable resistive layers 22 are formed on upper parts of the diode layers 21 (FIG. 4D). As explained in the first embodiment, oxidation time is adjusted such that the depth of the silicide layers 82 to be forcibly oxidized is set to be equal to or smaller than the depth of the diode layers 21 silicided in FIG. 4B.

Figure 4E:
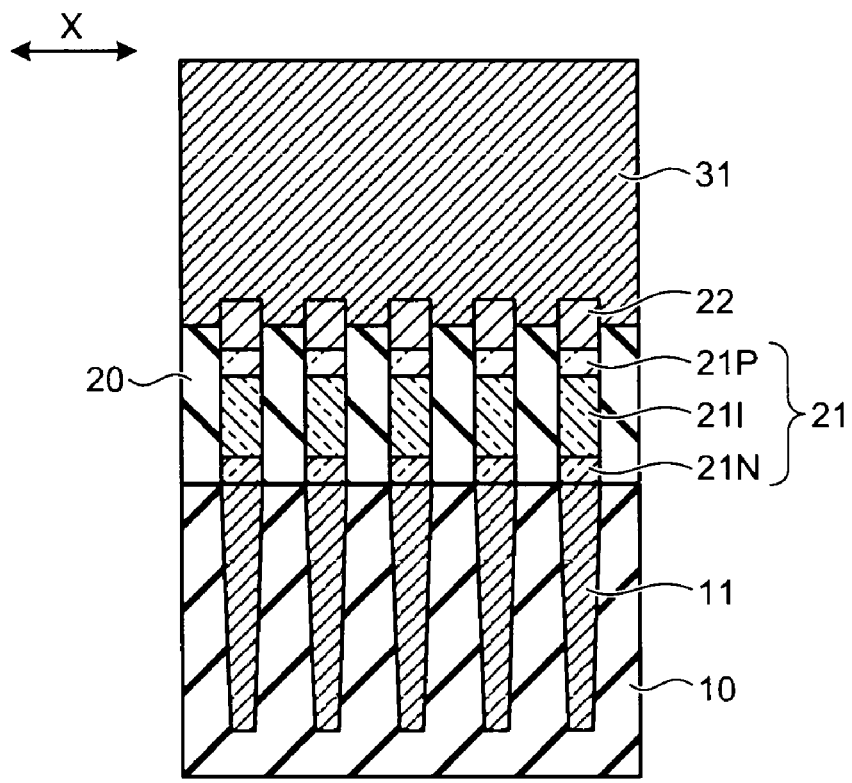

After the not-shown third interlayer insulating film is formed on the variable resistive layers 22 and the second interlayer insulating film 20, the upper surface of the third interlayer insulating film is planarized. Thereafter, a resist material is applied on the third interlayer insulating film. A not-shown mask is formed to have a shape corresponding to the second wires 31 by the photolithography technique. The third interlayer insulating film is etched by using this mask to form grooves for a second wire. A metal material such as W is embedded in the grooves to form the second wires 31 as upper layer wires (FIG. 4E). The described steps are repeated by a necessary number of times to form a pad wire in a top layer, whereby the nonvolatile memory device is completed.

According to the second embodiment, the metal film 81 is formed after setting the upper surface of the diode layers 21 and the second interlayer insulating film 20 at substantially the same heights. After the silicide reaction, the unnecessary portions in the upper parts of the diode layers 21 are removed. Therefore, as in the first embodiment, there is an effect that it is possible to prevent the likelihood that a distance between the upper parts of the diode layers 21 which are expanded by the silicide reaction in the memory cells adjacent to each other is reduced to cause deficiencies in terms of device operation.

The silicide treatment and the forcible oxidation treatment are performed after setting the upper surfaces of the diode layers 21 and the second interlayer insulating film 20 at substantially the same height. Therefore, the processing for embedding the cap film in the step which is formed by etching back the upper surface of the diode layers 21 before the formation of the second wires 31 such as the first embodiment is unnecessary. There is also an effect that processing can be simplified compared with the processing steps in the first embodiment.

In the first and second embodiments, the columnar diode layers are obtained by etching after the semiconductor layers are laminated on the interlayer insulating film. In a third embodiment of the present invention, a method of forming columnar memory cells in cross-points of the first wires and the second wires by combining stripe-like patterning in the X direction and stripe-like patterning in the Y direction is explained below.

Figure 5A:
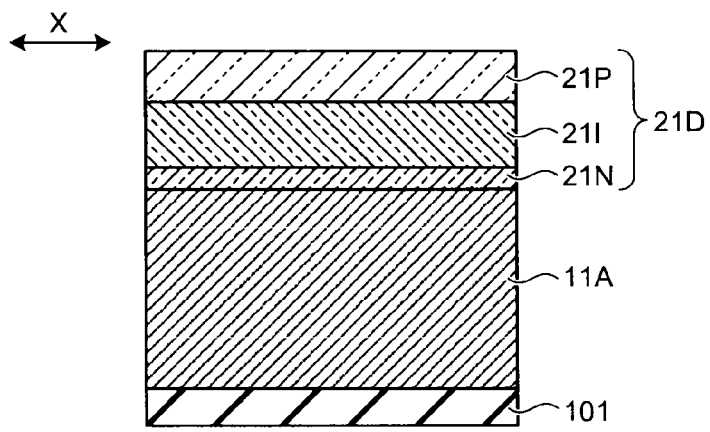
FIGS. 5A to 5P are schematic sectional views in a direction parallel to second wires of an example of a procedure for a method of manufacturing a nonvolatile memory device according to a third embodiment of the present invention.
Figure 5B:
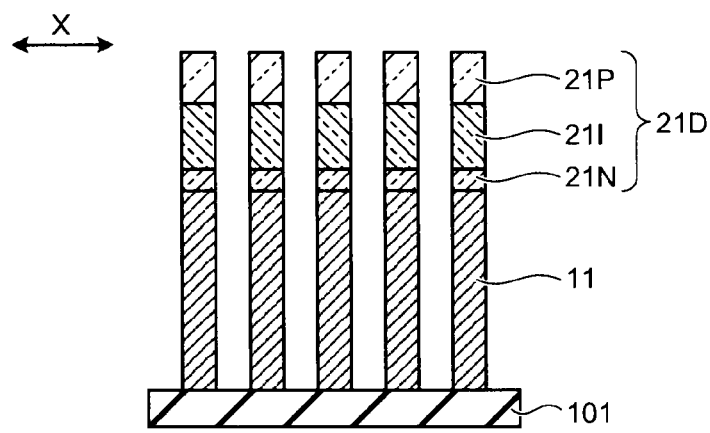
Figure 5C:
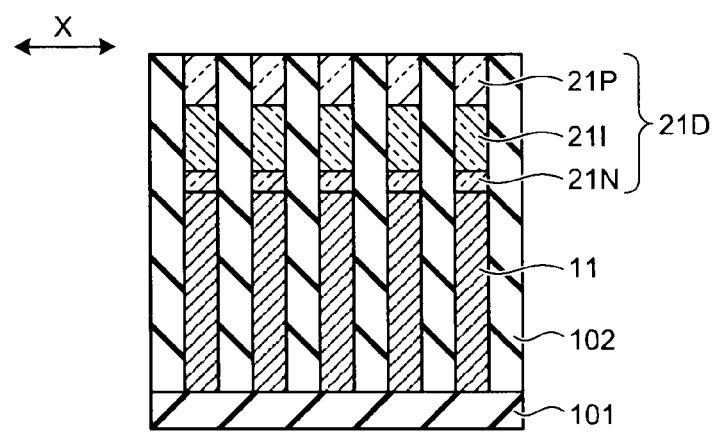
Figure 5D:
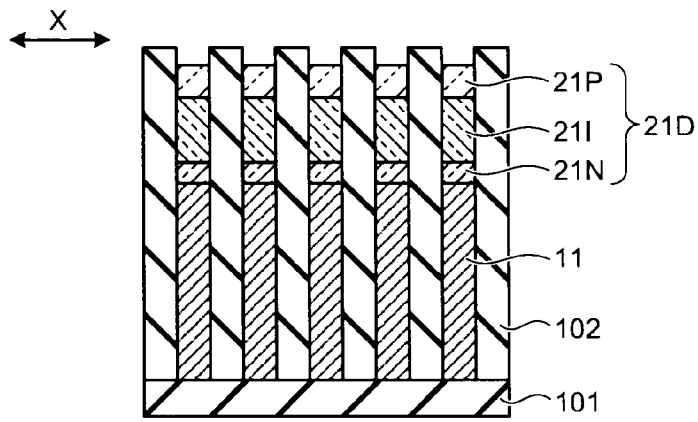
Figure 5E:
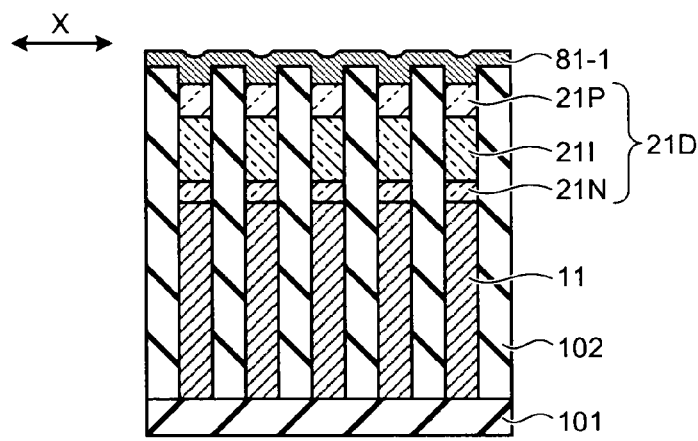
Figure 5F:
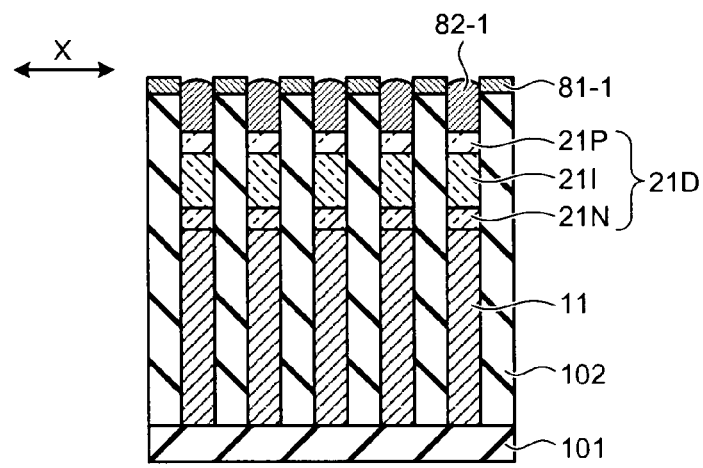
Figure 5G:
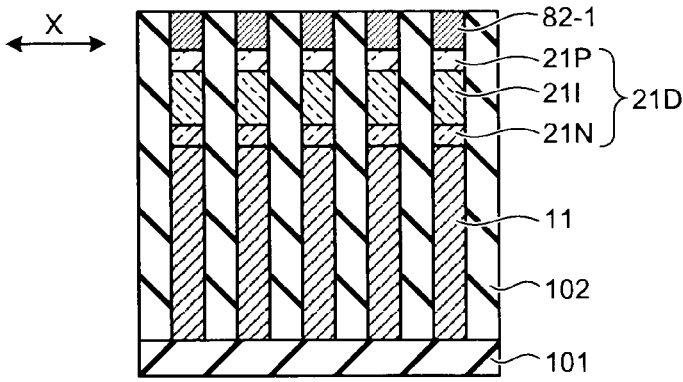
Figure 5H:
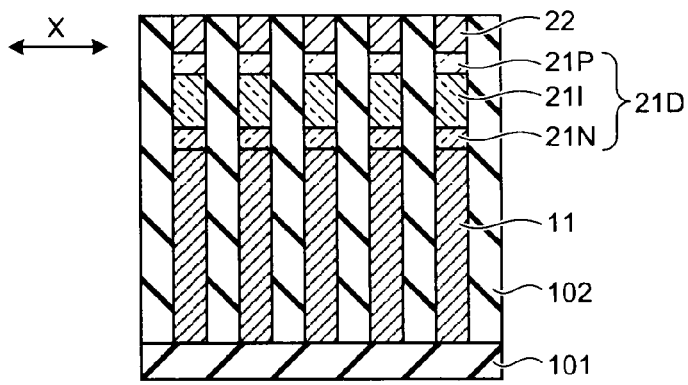
Figure 5I:
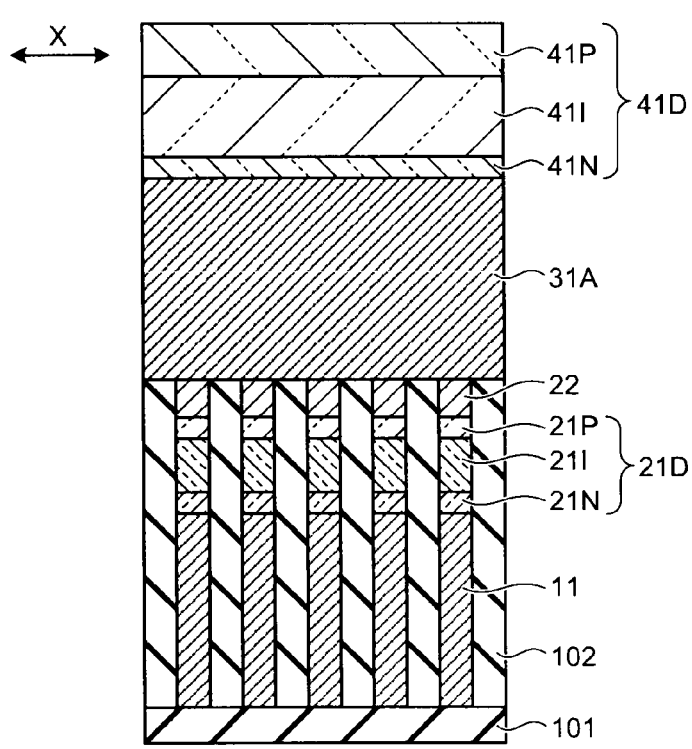
Figure 5J:
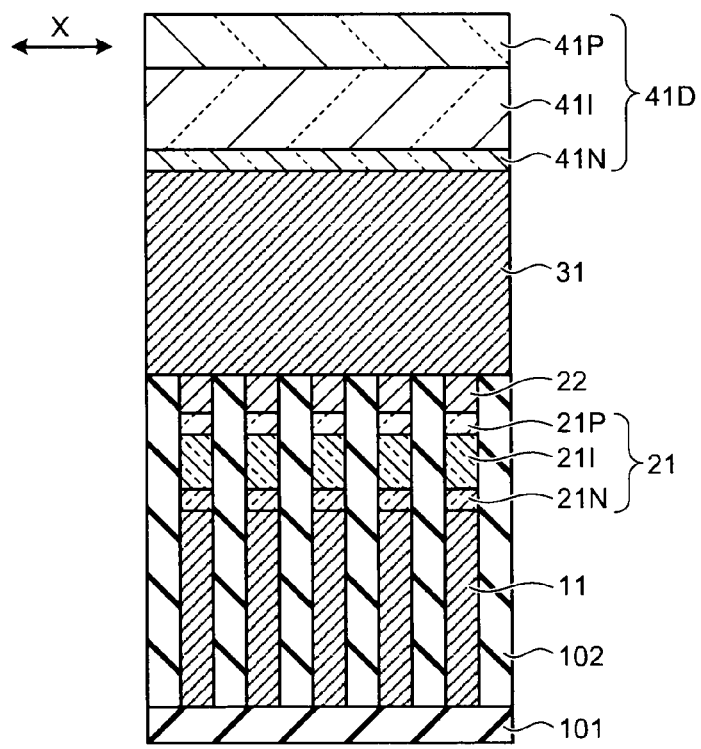
Figure 5K:
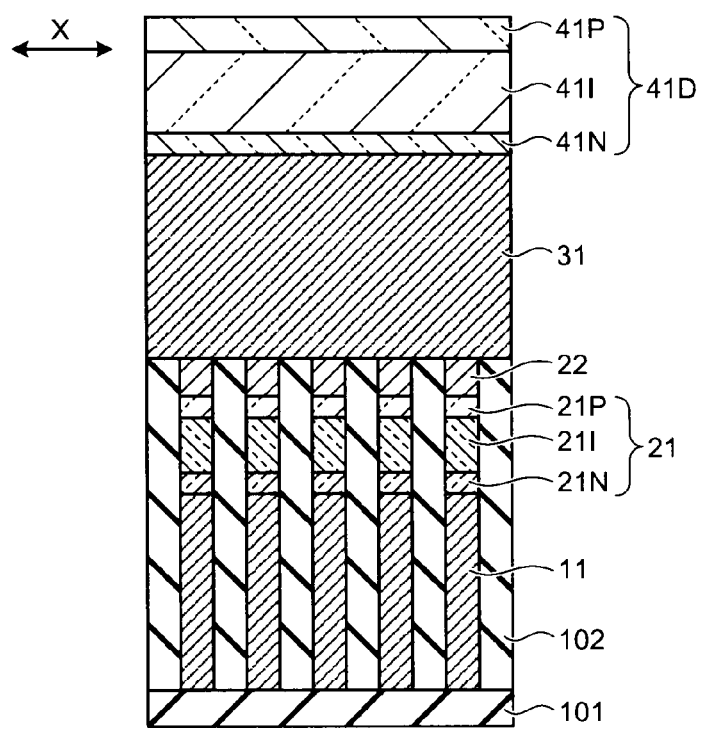
Figure 5L:
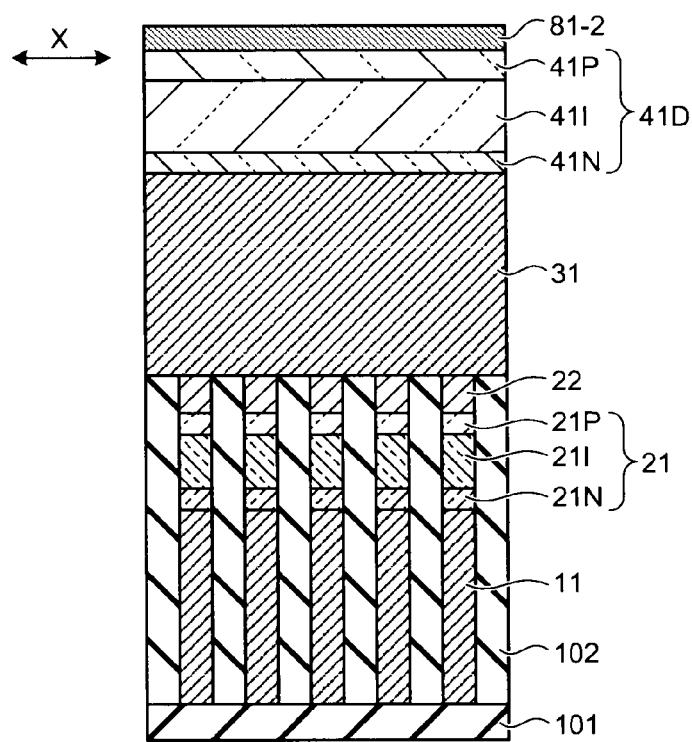
Figure 5M:
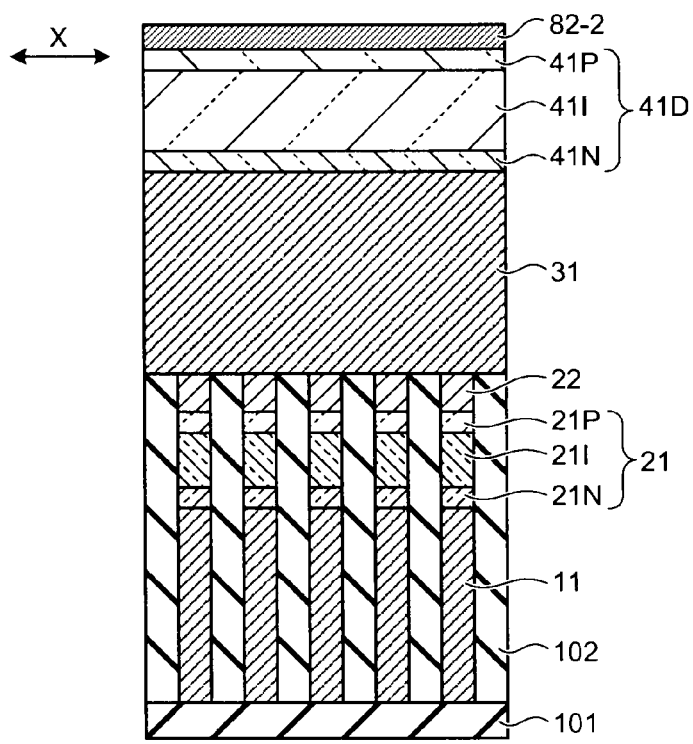
Figure 5N:
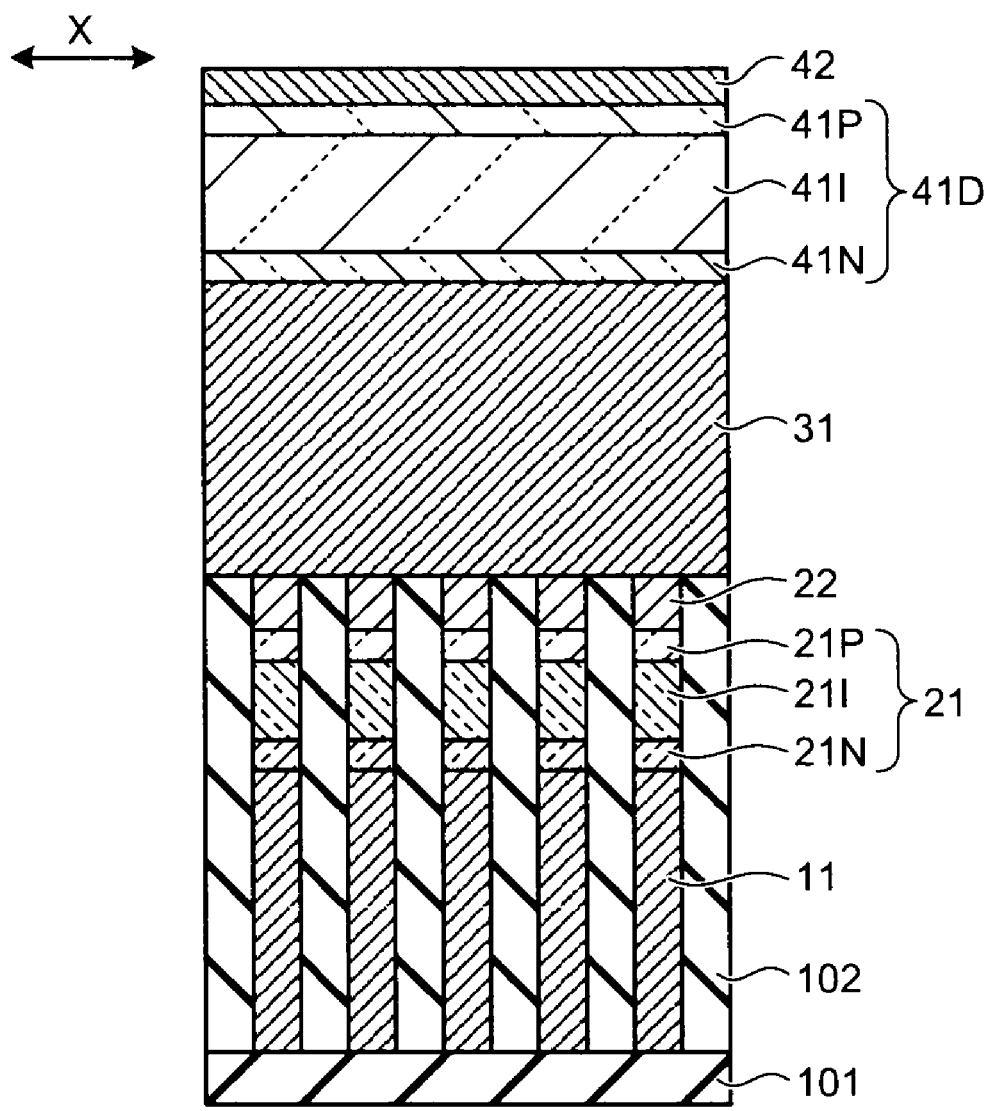
Figure 5O:
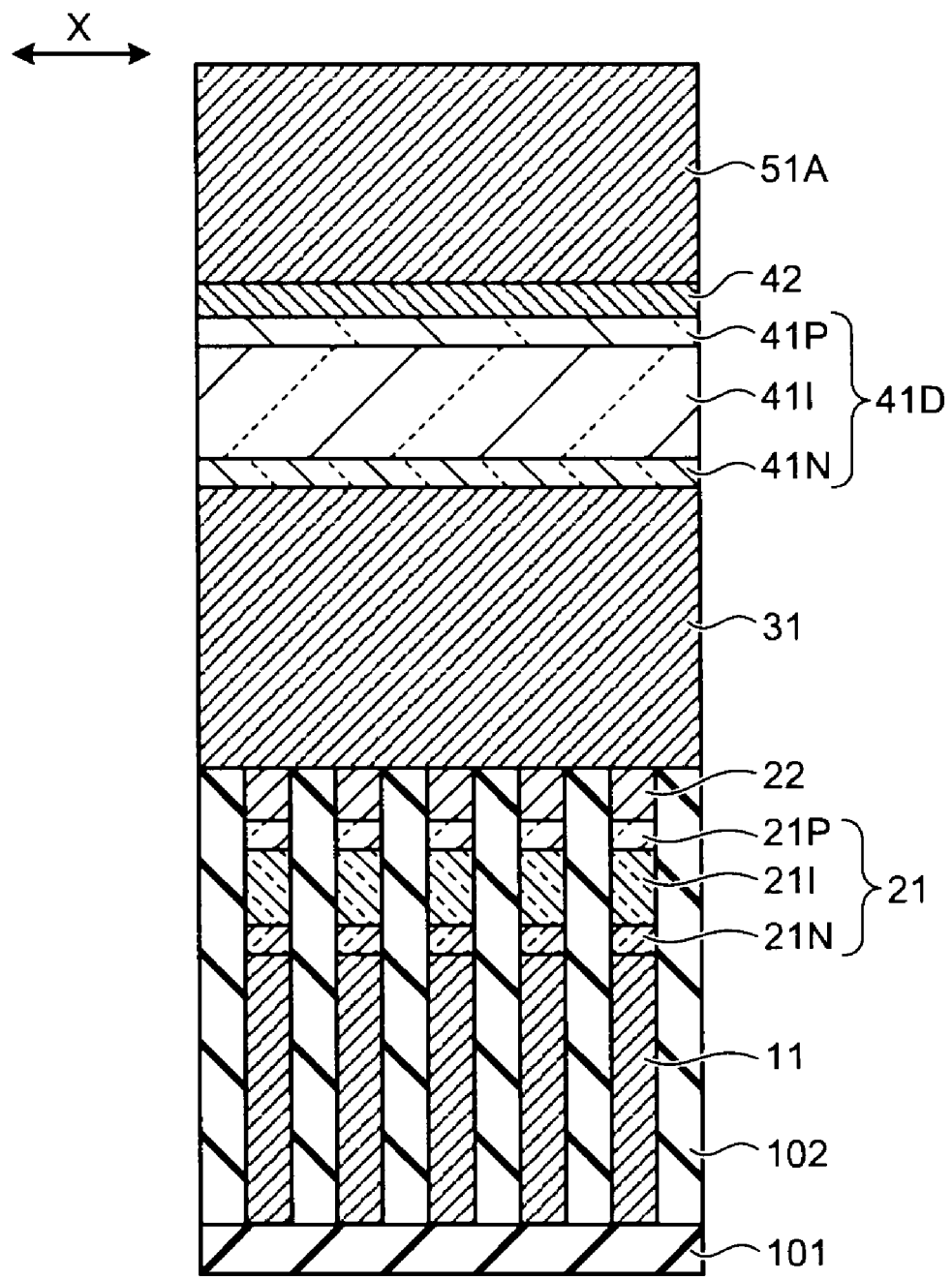
Figure 5P:
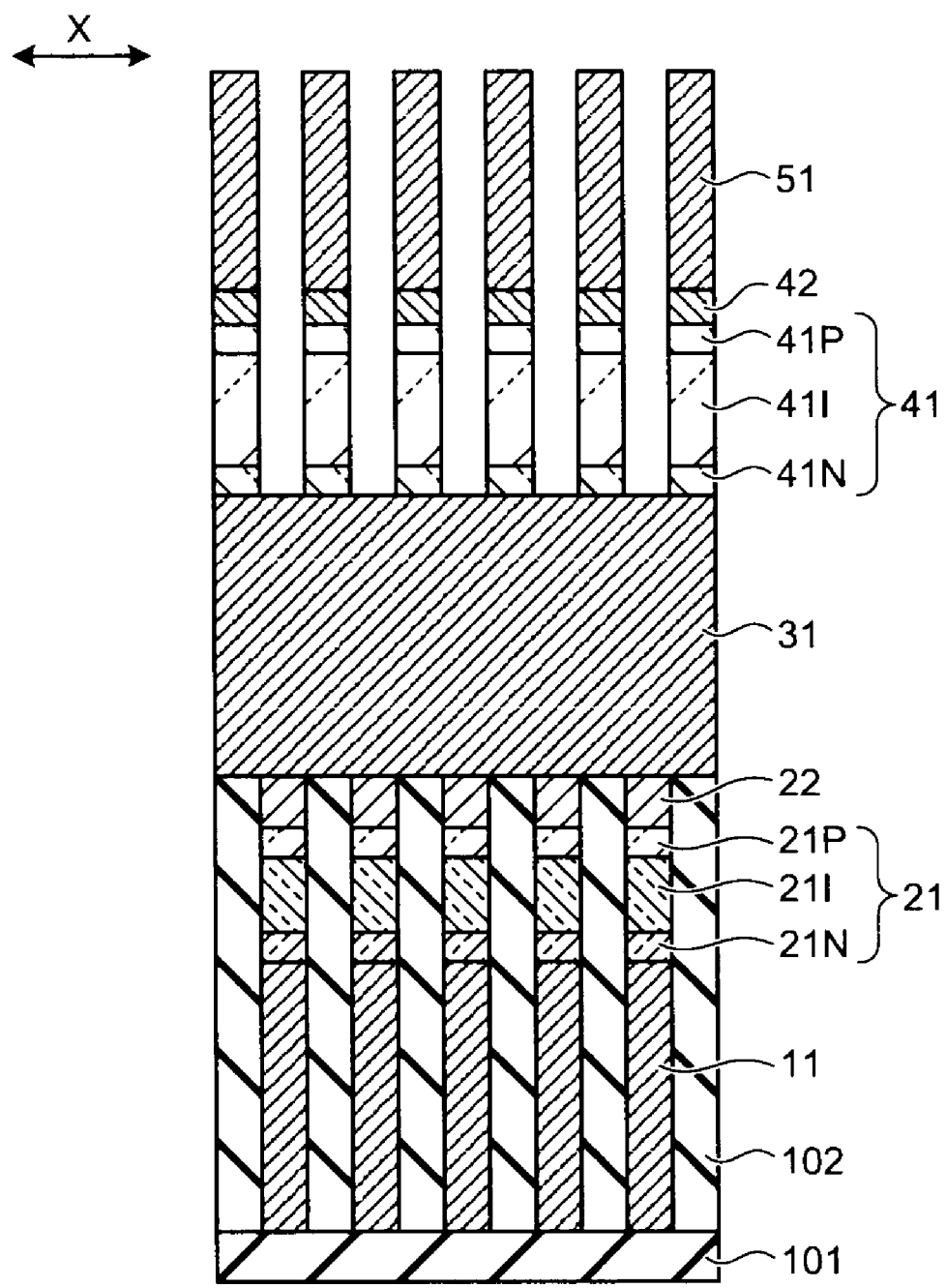

FIGS. 5A to 5P are schematic sectional views in a direction parallel to the second wires of an example of a procedure for a method of manufacturing a nonvolatile memory device according to the third embodiment. FIGS. 6A to 6M are schematic sectional views in a direction perpendicular to the second wires of an example of the procedure for the method of manufacturing a nonvolatile memory device according to the third embodiment. An extending direction of the second wires is the X direction and a direction perpendicular to the X direction is the Y direction.

Figure 6A:
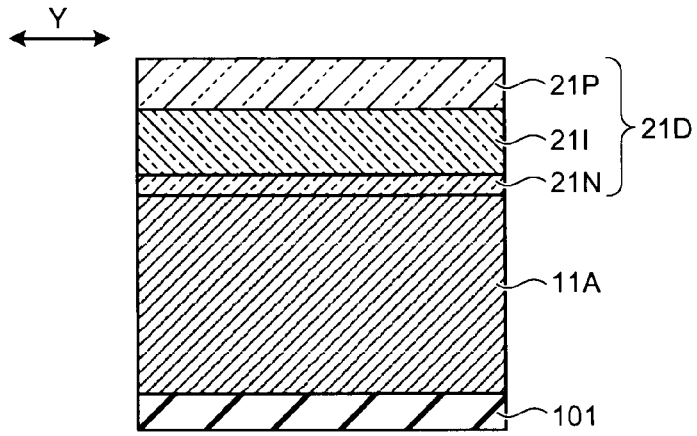
FIGS. 6A to 6M are schematic sectional views in a direction perpendicular to the second wires of an example of the procedure for the method of manufacturing a nonvolatile memory device according to the third embodiment.

First, a first interlayer insulating film 101 is formed on a not-shown substrate such as a Si substrate on which elements such as CMOS transistors are formed. A first wiring layer 11A made of a metal wiring material such as W is formed on the first interlayer insulating film 101 by a film preparation method such as the sputter method. Subsequently, the first diode layer 21D having the PIN structure is formed by a film preparation method such as the CVD method (FIGS. 5A and 6A). As in the first embodiment, the first diode layer 21D is formed by depositing the N-type polysilicon film 21N, the I-type polysilicon film 21I, and the P-type polysilicon film 21P in order on the first wiring layer 11A.

Thereafter, a resist is applied on the first diode layer 21D. A mask having a stripe-like pattern extending in the Y direction is formed. The first diode layer 21D and the first wiring layer 11A are etched by the anisotropic etching such as the RIE method using the mask (FIG. 5B). Consequently, the first wires 11 of a straight wire shape extending in the Y direction are arranged at predetermined intervals in the X direction. The first diode layers 21D of a straight wire shape also extending in the Y direction are formed on the first wires 11.

A second interlayer insulating film 102 is deposited to fill spaces among laminated bodies (structures) of the first wire 11 and the first diode layer 21D having the straight wire shape by using a film preparation method having a satisfactory embedding characteristic. It is assumed that a HDP-USG film is formed as the second interlayer insulating film 102 by the plasma CVD method. The upper surface of the second interlayer insulating film 102 is planarized by a method such as the CMP method until the upper surfaces of the first diode layers 21D are exposed (FIG. 5C).

Figure 6B:
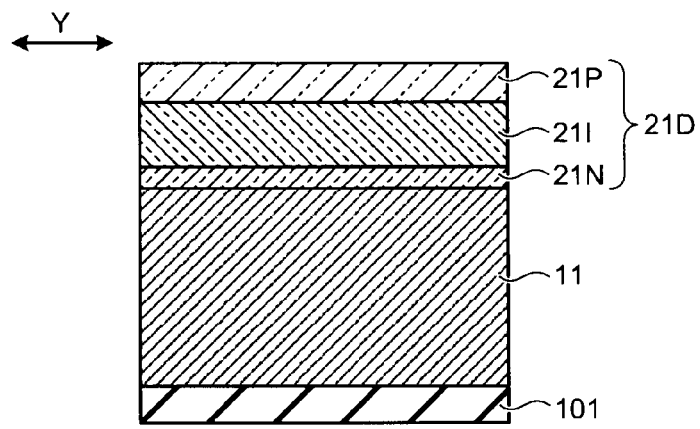
Figure 6C:
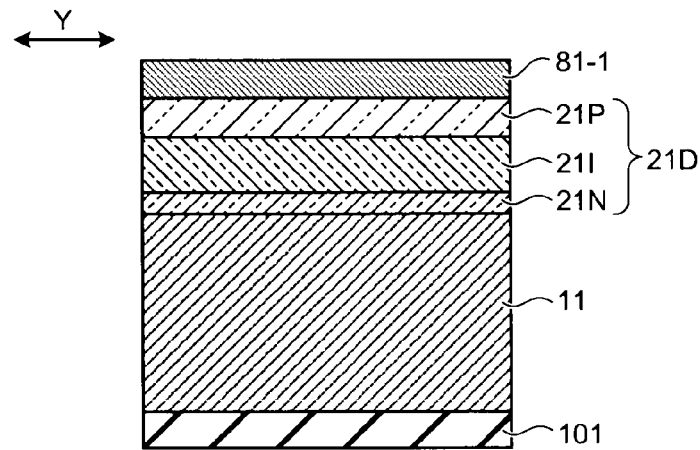
Figure 6D:
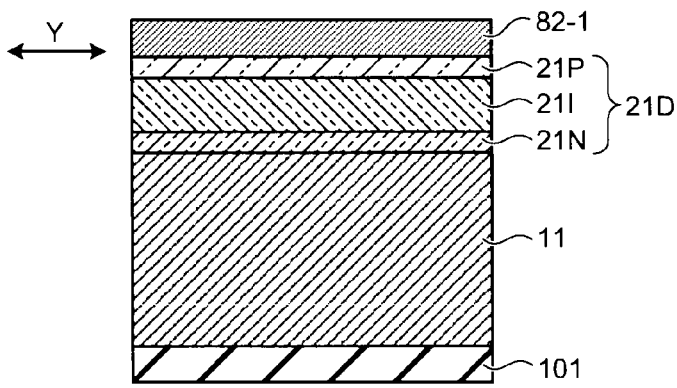

Thereafter, the anisotropic etching is performed under a condition that the diode layers 21D are more easily etched than the second interlayer insulating film 102. The upper surfaces of the diode layers 21D are etched back by appropriate depth (FIGS. 5D and 6B). Thereafter, a metal film 81-1 containing metal (e.g., Ni, Mn, or Ti) whose oxide functions as a variable resistive material and which reacts with silicon through heat treatment and forms metal silicide, is deposited (FIGS. 5E and 6C). The heat treatment is performed to silicide the diode layers 21D up to appropriate depth from the surface. Thereby, a silicide layers 82-1 are formed on the surface of the first diode layers 21D (FIGS. 5F and 6D). The metal film 81-1 does not react with the second interlayer insulating film 102 through the heat treatment.

The non-reacting metal film 81-1 on the first diode layers 21D (the silicide layers 82-1) and the metal film 81-1 formed on the upper surface and sides of the second interlayer insulating film 102 are removed by a method such as wet cleaning treatment. The silicided first diode layers 21D and the upper surface of the second interlayer insulating film 102 are planarized by the CMP treatment (FIG. 5G). Consequently, only the exposed surface portions of the first diode layers 21D (polysilicon) in FIGS. 5D and 6B are silicided in a self-aligning manner.

Figure 6E:
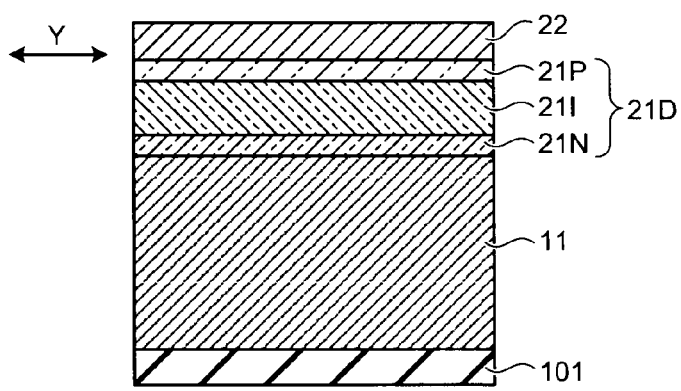

Thereafter, the surfaces of the silicide layers 82-1 are forcibly oxidized and changed to a metal oxide by a method such as thermal oxidation treatment in an oxygen atmosphere to form variable resistive layers 22 on upper parts of the first diode layers 21D (FIGS. 5H and 6E). For example, the silicide layers 82-1 in a range of depth of 5 nanometers to 10 nanometers from the surfaces are forcibly oxidized and changed to the first variable resistive layers 22. As in the first embodiment, oxidation time is adjusted to such that the depth of the silicide layers 82-1 to be forcibly oxidized is set to be equal to or smaller than the depth of the first diode layer 21D to have been silicided in FIGS. 5F and 6D.

Figure 6F:
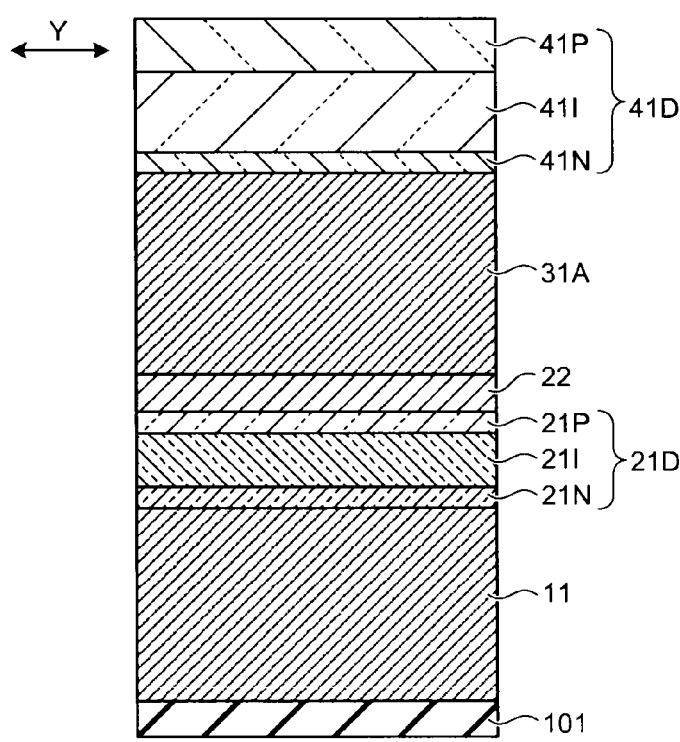

Thereafter, a second wiring layer 31A made of a metal wiring material such as W is deposited on the first variable resistive layers 22 and the second interlayer insulating film 102 by a method such as the sputter method. A second diode layer 41D in which an N-type polysilicon film 41N, an I-type polysilicon film 41I, and a P-type polysilicon film 41P are laminated in order is formed by a method such as the CVD method (FIGS. 5I and 6F).

Figure 6G:
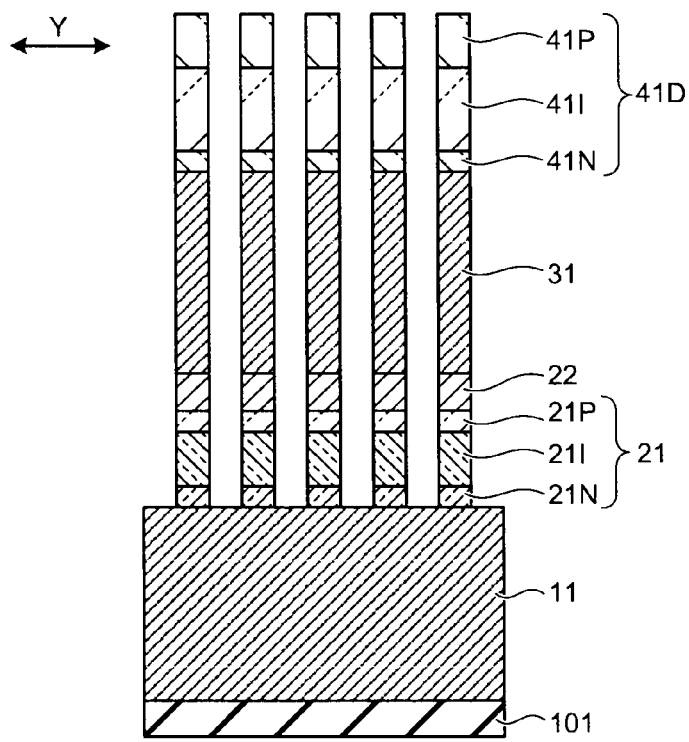

Subsequently, a resist is applied on the second diode layer 41D. A mask having a stripe-like pattern extending in the X direction is formed by the photolithography technique. The second diode layer 41D, the second wiring layer 31A, and laminated bodies of the first diode layer 21D and the first variable resistive layer 22 are etched by the anisotropic etching such as the RIE method using the mask (FIGS. 5J and 6G). Consequently, second wires 31 of a straight wire shape extending in the X direction are arranged at predetermined intervals in the Y direction. Second diode layers 41D of a straight wire shape also extending in the X direction are formed on the second wires 31. Only cross-point positions of the first wires 11 and the second wires 31 are left in the first diode layers 21D by the etching to form the first diode layers 21 having columnar structure.

Figure 6H:
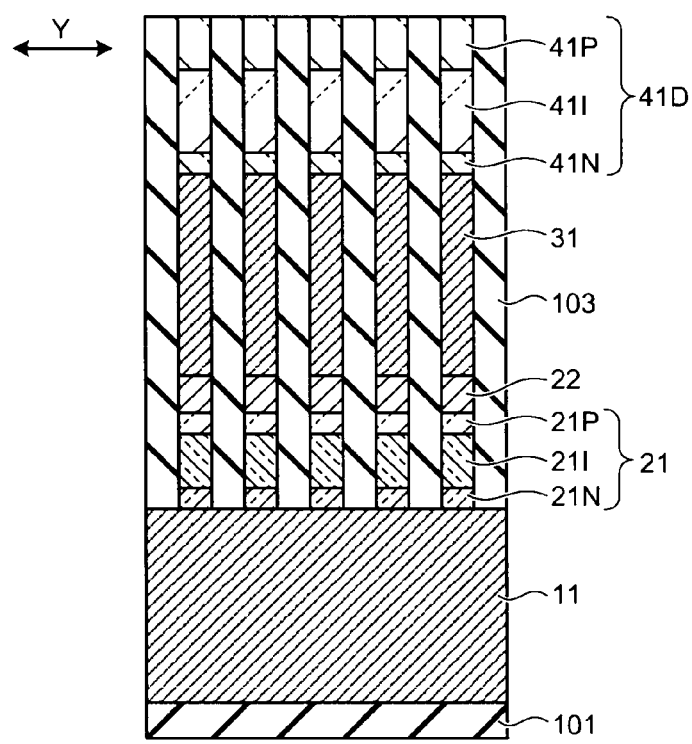

Thereafter, the third interlayer insulating film 103 is deposited to fill spaces among the columnar first diode layers 21 and among laminated bodies of the second wire 31 and the second diode layer 41D having the straight wire shape by using a film preparation method having a satisfactory embedding characteristic. It is assumed that a HDP-USG film is formed as the third interlayer insulating film 103 by the plasma CVD method. The upper surface of the third interlayer insulating film 103 is planarized by a method such as the CMP method until the upper surfaces of the second diode layers 41D are exposed (FIG. 6H).

Figure 6I:
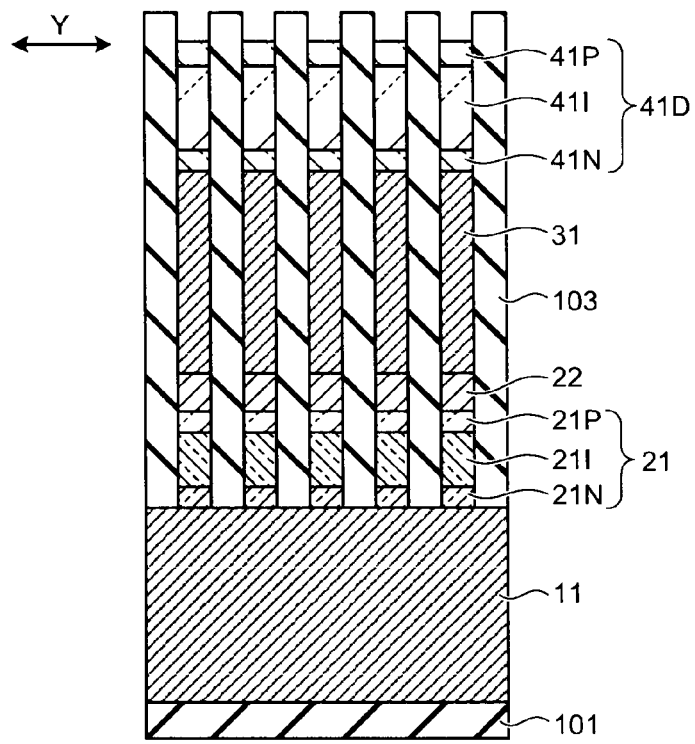
Figure 6J:
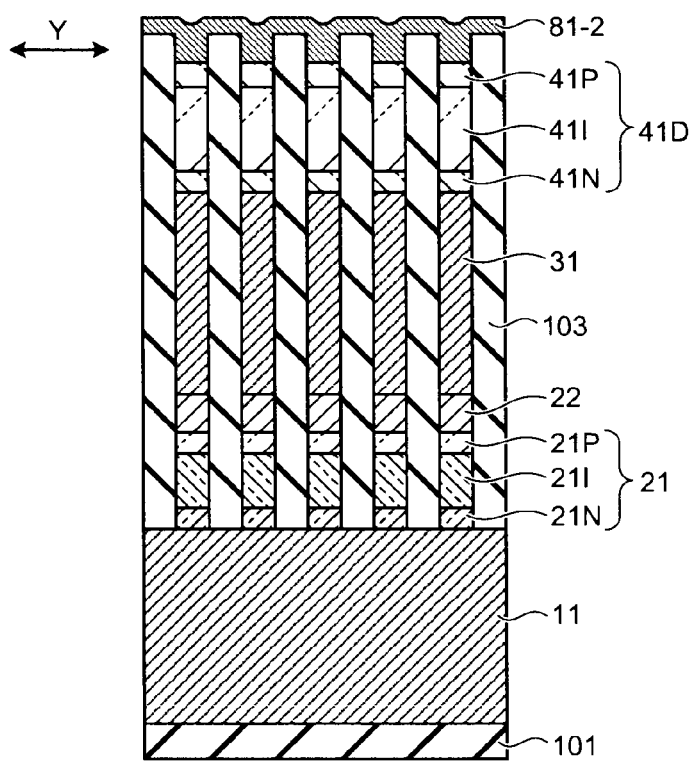
Figure 6K:
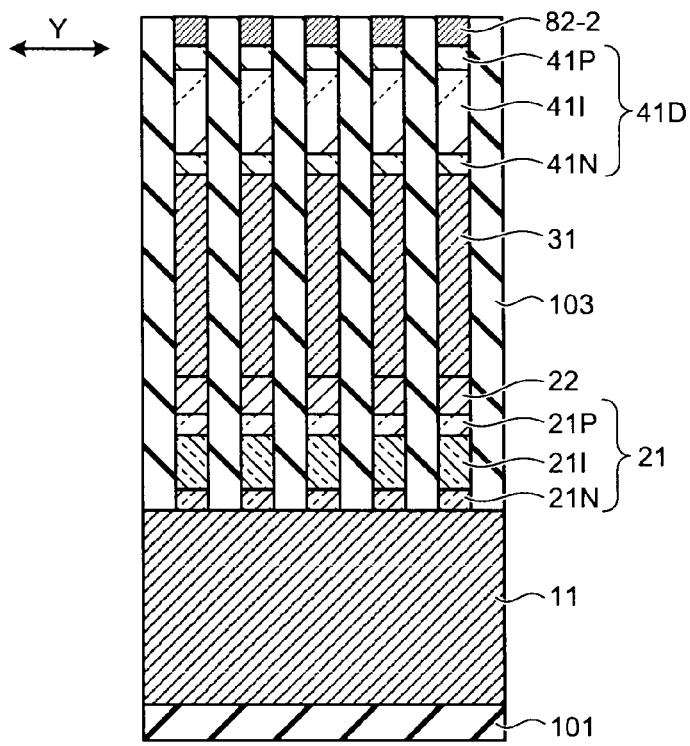
Figure 6L:
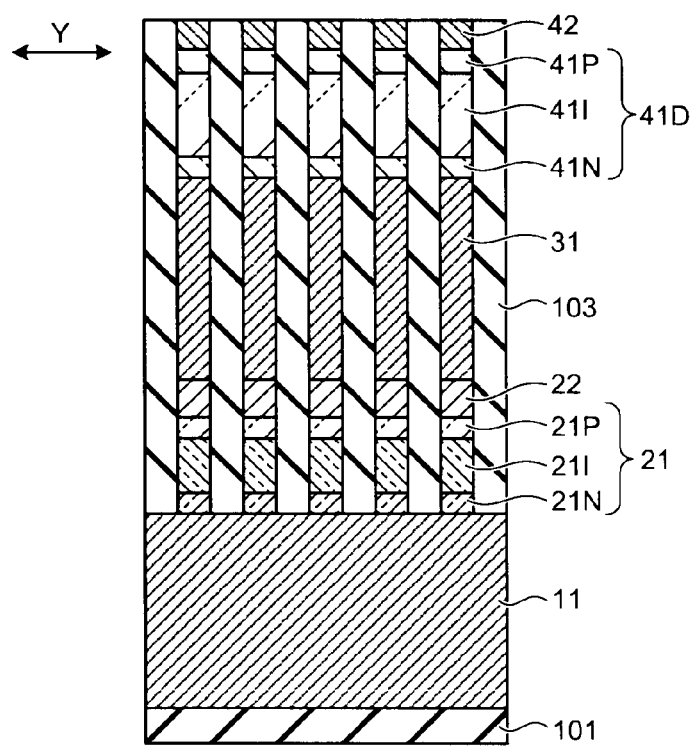

Thereafter, processing is performed in the same manner as the procedure for forming the first variable resistive layers 22. The upper surfaces of the second diode layers 41D are etched back by appropriate depth (FIGS. 5K and 6I). Thereafter, a metal film 81-2 containing metal whose oxide functions as a variable resistive material and which reacts with silicon through heat treatment and forms metal silicide, is deposited (FIGS. 5L and 6J). Thereafter, the heat treatment is performed to form silicide layers 82-2 having appropriate depth in the surfaces of the second diode layers 41D. The non-reacting metal film 81-2 on the second diode layers 41D (the silicide layers 82-2) and the metal film 81-2 formed on the upper surface and sides of the third interlayer insulating film 103 are removed by a method such as wet cleaning treatment. The upper surfaces of the silicided second diode layers 41D and the third interlayer insulating film 103 are planarized by the CMP treatment (FIGS. 5M and 6K). The surfaces of the silicide layers 82-2 are forcibly oxidized by a method such as thermal oxidation treatment in an oxygen atmosphere to form second variable resistive layers 42 made of a metal oxide (FIGS. 5N and 6L).

Figure 6M:
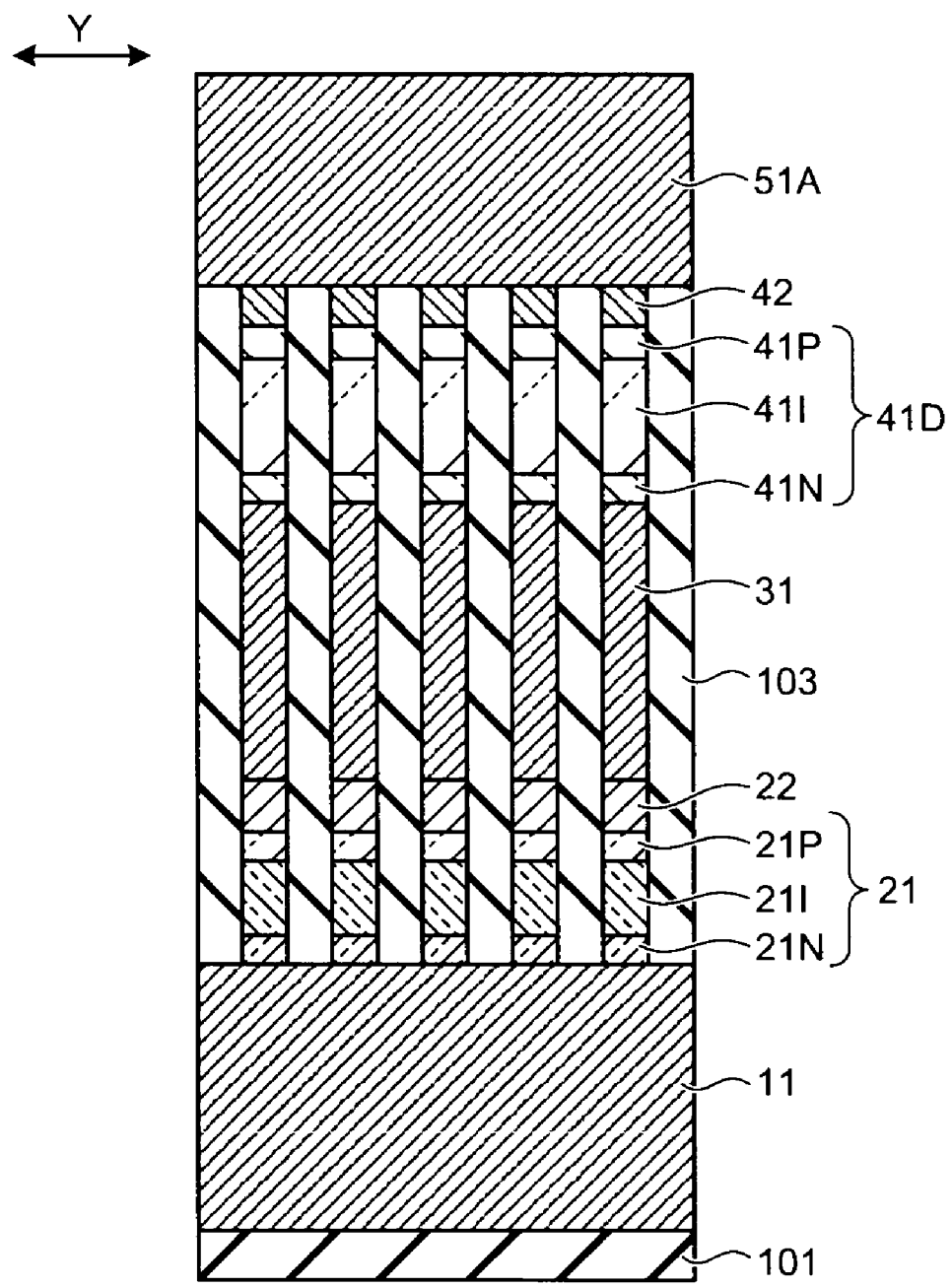

Thereafter, a third wiring layer 51A made of a metal wiring material such as W is deposited on the second variable resistive layers 42 and the third interlayer insulating film 103 by a method such as the sputter method (FIGS. 5O and 6M).

Subsequently, a resist is applied on the third wiring layer 51A. A mask having a stripe-like pattern extending in the Y direction is formed by the photolithography technique. The third wiring layer 51A and laminated bodies of the second diode layer 41D and the second variable resistive layer 42 are etched by the anisotropic etching such as the RIE method using this mask. Consequently, the second wires 51 of a straight wire shape extending in the Y direction are arranged at predetermined intervals in the X direction. Only cross-point positions of the second wires 31 and the third wires 51 are left in the second diode layers 41D by the etching. Thereby the second diode layers 41 having columnar structure are formed (FIG. 5P).

Thereafter, a not-shown fourth interlayer insulating film is embedded in grooves formed in a stripe shape and the fourth interlayer insulating film is planarized until the upper surfaces of the third wires 51 are exposed. Finally, a pad wire is formed, whereby a nonvolatile memory device is completed. In the above explanation, the variable resistance memory cells are laminated in two layers. However, a nonvolatile memory device in which three or more layers of variable resistance memory cells are laminated can be obtained by repeating the steps explained above.

According to the third embodiment, after the laminated bodies with the first wire 11 and the first diode layer 21D are formed as pattern extending in the X direction, the second interlayer insulating film 102 is embedded among the patterns. Then, the upper parts of the first diode layers 21D are silicided and forcibly oxidized to form the first variable resistive layers 22. Thereafter, when the laminated bodies with the second wire 31 and the second diode layer 41D are formed as patterns extending in the Y direction orthogonal to the X direction, etching is performed up to the lower first diode layers 21D. Thereafter, the processing is repeated a predetermined number of times to form the nonvolatile memory device. Consequently, the variable resistance memory cells can be processed in columnar structure only by patterning of a straight wire shape. Therefore, there is an effect that it is possible to prevent the likelihood of collapse of columnar memory cells feared in, after forming diode layers and variable resistive layers on a lower wiring layers, directly etching the diode layers and the variable resistive layers in a columnar shape.

As explained above, according to the embodiments of the present invention, there is an effect that it is possible to obtain a method of manufacturing a nonvolatile memory device that can reduce the likelihood of collapse of patterns after etching in a nonvolatile memory device in which variable resistance memory cells including laminated diode material and variable resistive material are arranged in a matrix shape.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a nonvolatile memory device comprising:

forming a metal film containing metal whose oxide functions as a variable resistive material and which reacts with silicon through heat treatment and forms metal silicide, on an interlayer insulating film having a silicon layer with rectification whose surface is exposed, which is connected to a first wire and is patterned in a predetermined shape;

performing the heat treatment to form a silicide layer on a surface of the silicon layer in a self-aligning manner;

oxidizing the silicide layer to form a variable resistive layer on an upper part of the silicon layer; and forming a second wire having a predetermined shape coupled to the variable resistive layer.

2. The method of manufacturing a nonvolatile memory device according to claim 1, further comprising:

etching back, before forming the metal film, an upper surface of the silicon layer to be lower than an upper surface of the interlayer insulating film; and embedding, before forming the second wire, a cap film made of metal on the variable resistive layer in a step which is formed by etching back the upper surface of the silicon layer, the second wire being formed after planarizing the upper surface of the interlayer insulating film and an upper surface of the cap film with CMP treatment.

3. The method of manufacturing a nonvolatile memory device according to claim 1, wherein forming the metal film comprises forming the metal film in a state in which an upper surface of the silicon layer is set to height substantially the same as height of an upper surface of the interlayer insulating film; and performing the heat treatment comprises removing the non-reacting metal film on the interlayer insulating film and the silicide layer after forming the silicide layer.

4. The method of manufacturing a nonvolatile memory device according to claim 3, further comprising removing the silicide layer formed on the upper surface of the interlayer insulating film after removing the non-reacting metal film.

5. The method of manufacturing a nonvolatile memory device according to claim 1, wherein time for the oxidation is adjusted to set thickness of a metal oxide film, which is formed by oxidizing the metal in the silicide layer, to be equal to or smaller than thickness of the silicide layer when the silicide layer is formed.

6. The method of manufacturing a nonvolatile memory device according to claim 1, wherein the metal film contains at least one of Ni, Mn, and Ti.

7. The method of manufacturing a nonvolatile memory device according to claim 1, wherein the silicon layer has PIN structure.

8. A method of manufacturing a nonvolatile memory device comprising:

forming a plurality of first wires extending in parallel in a first direction;

forming a silicon film with rectification above the first wires;

patterning the silicon film in a columnar shape to form silicon layers to be coupled to the first wires;

embedding an interlayer insulating film among the columnar silicon layers;

forming, on the interlayer insulating film having the silicon layers with surfaces thereof exposed, a metal film containing metal whose oxide functions as a variable resistive material and which reacts with silicon through heat treatment and forms metal silicide;

performing the heat treatment to form silicide layers on surfaces of the silicon layers in a self-aligning manner;

oxidizing the silicide layers to form variable resistive layers on upper parts of the silicon layers; and forming a plurality of second wires coupled to the variable resistive layers and extending in parallel in a second direction crossing the first direction.

9. The method of manufacturing a nonvolatile memory device according to claim 8, further comprising:

etching back, before forming the metal film, upper surfaces of the silicon layers to be lower than an upper surface of the interlayer insulating film; and embedding, before forming the second wire, a cap film made of metal on the variable resistive layers in steps which are formed by etching back the upper surfaces of the silicon layers, the second wire being formed after planarizing the upper surface of the interlayer insulating film and an upper surface of the cap film with CMP treatment.

10. The method of manufacturing a nonvolatile memory device according to claim 8, wherein forming the metal film comprises forming the metal film in a state in which upper surfaces of the silicon layers are set to height substantially the same as height of an upper surface of the interlayer insulating film; and performing the heat treatment comprises removing the non-reacting metal film on the interlayer insulating film and the silicide layers after forming the silicide layers.

11. The method of manufacturing a nonvolatile memory device according to claim 10, further comprising removing the silicide layers formed on the upper surface of the interlayer insulating film after removing the non-reacting metal film.

12. The method of manufacturing a nonvolatile memory device according to claim 8, wherein time for the oxidation is adjusted to set thickness of a metal oxide film, which is formed by oxidizing the metal in the silicide layers, to be equal to or smaller than thickness of the silicide layers when the silicide layers are formed.

13. The method of manufacturing a nonvolatile memory device according to claim 8, wherein the metal film contains at least one of Ni, Mn, and Ti.

14. The method of manufacturing a nonvolatile memory device according to claim 8, further comprising performing, one or more times, processing for forming, after forming a lower nonvolatile memory layer from the formation of the first wires to the formation of the second wires, an upper nonvolatile memory layer from the formation of the silicon films to the formation of the second wires with the second wires of the lower nonvolatile memory layer set as first wires of the upper nonvolatile memory layer.

15. A method of manufacturing a nonvolatile memory device comprising:

laminating, in order, a first wiring layer as a material of a first wire and a silicon film having rectification;

patterning the first wiring layer and the silicon film in a stripe shape extending in a predetermined direction;

embedding an interlayer insulating film between lower structures patterned in the stripe shape;

forming, on the interlayer insulating film having the silicon film with a surface thereof exposed, a metal film containing metal whose oxide functions as a variable resistive material and which reacts with silicon through heat treatment and forms metal silicide;

performing the heat treatment to form a silicide layer on a surface of the silicon film in a self-aligning manner;

oxidizing the silicide layer to form a variable resistive layer on an upper part of the silicon film;

forming a second wiring layer as a material of a second wire above the variable resistive layer and the interlayer insulating film; and patterning, in a stripe shape extending in a direction perpendicular to the lower structures below the second wiring layer, the second wiring layer, the variable resistive layer, and the silicon film in the lower structures.

16. The method of manufacturing a nonvolatile memory device according to claim 15, further comprising performing, one or more times, processing for laminating, after forming the variable resistive layer, an upper wiring layer and an upper silicon film with rectification in order above the lower interlayer insulating film having the variable resistive layer with a surface thereof exposed, patterning, in a stripe shape extending in a direction perpendicular to the lower structures, the upper silicon film, the upper wiring layer, the variable resistive layer, and the silicon film in the lower structures to form upper structures, embedding an upper interlayer insulating film among the upper structures patterned in the stripe shape, forming, on the upper interlayer insulating film having the upper silicon film with a surface thereof exposed, a metal film containing metal whose oxide functions as a variable resistive material and which reacts with silicon through heat treatment and forms metal silicide, performing the heat treatment to form an upper silicide layer in a self-aligning manner on a surface of the upper silicon film in the upper structures, and, thereafter, oxidizing the upper silicide layer to form an upper variable resistive layer on an upper part of the upper silicon film.

17. The method of manufacturing a nonvolatile memory device according to claim 15, further comprising etching back, before forming the metal film, an upper surface of the silicon film to be lower than an upper surface of the interlayer insulating film.

18. The method of manufacturing a nonvolatile memory device according to claim 17, wherein etching back the silicon film comprises performing the etch-back with anisotropic etching under a condition that the silicon film is more easily etched than the interlayer insulating film.

19. The method of manufacturing a nonvolatile memory device according to claim 15, wherein time for the oxidation is adjusted to set thickness of a metal oxide film, which is formed by oxidizing the metal in the silicide layer, to be equal to or smaller than thickness of the silicide layer when the silicide layer is formed.

20. The method of manufacturing a nonvolatile memory device according to claim 15, wherein the metal film contains at least one of Ni, Mn, and Ti.

* * * * *